US011563197B2

(12) United States Patent
Li et al.

(10) Patent No.: US 11,563,197 B2
(45) Date of Patent: Jan. 24, 2023

(54) DISPLAY PANEL AND APPARATUS, AND FABRICATING METHOD THEREOF

(71) Applicant: BOE Technology Group Co., Ltd., Beijing (CN)

(72) Inventors: Xiaolong Li, Beijing (CN); Fangzhen Zhang, Beijing (CN); Wei Qin, Beijing (CN); Kuanjun Peng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 759 days.

(21) Appl. No.: 16/344,009

(22) PCT Filed: Mar. 29, 2018

(86) PCT No.: PCT/CN2018/081164
§ 371 (c)(1),
(2) Date: Apr. 22, 2019

(87) PCT Pub. No.: WO2019/183898
PCT Pub. Date: Oct. 3, 2019

(65) Prior Publication Data
US 2021/0359272 A1   Nov. 18, 2021

(51) Int. Cl.
*H01L 51/52* (2006.01)
*H01L 27/32* (2006.01)
*H01L 25/065* (2006.01)

(52) U.S. Cl.
CPC ...... *H01L 51/5271* (2013.01); *H01L 25/0657* (2013.01); *H01L 27/326* (2013.01);
(Continued)

(58) Field of Classification Search
CPC ............... H01L 51/5271; H01L 25/048; H01L 27/3244
See application file for complete search history.

(56) References Cited

U.S. PATENT DOCUMENTS

2008/0218070 A1* 9/2008 Kobayashi .......... H01L 51/5265
313/506
2013/0299808 A1   11/2013 Sugimoto et al.
(Continued)

FOREIGN PATENT DOCUMENTS

CN         103325318 A      9/2013
CN         104157669 A     11/2014
(Continued)

OTHER PUBLICATIONS

First Office Action in the Chinese Patent Application No. 201880000867.3, dated Oct. 11, 2021; English translation attached.
(Continued)

*Primary Examiner* — Michele Fan
(74) *Attorney, Agent, or Firm* — Intellectual Valley Law, P.C.

(57) ABSTRACT

The present application describes a display panel having a plurality of subpixels. Each of the plurality of subpixels has a light blocking region and a light transmissive region surrounding the light blocking region. Each of the plurality of subpixels in the light blocking region includes a first base substrate and a second base substrate facing each other; a first light emitting element and a first reflective block on a side of the first base substrate proximal to the second base substrate; and a second reflective block on a side of the second base substrate proximal to the first base substrate. The first reflective block and the second reflective block are configured to reflect light emitted from the first light emitting element to the light transmissive region thereby displaying an image.

19 Claims, 16 Drawing Sheets

(52) U.S. Cl.
 CPC ...... *H01L 27/3251* (2013.01); *H01L 51/5268* (2013.01); *H01L 51/5284* (2013.01); *H01L 27/3211* (2013.01)

(56) References Cited

U.S. PATENT DOCUMENTS

| | | | |
|---|---|---|---|
| 2014/0160411 A1* | 6/2014 | Yim | H01L 51/5237 |
| | | | 313/504 |
| 2015/0303241 A1 | 10/2015 | Zhang et al. | |
| 2016/0087018 A1 | 3/2016 | Shim et al. | |
| 2016/0218143 A1* | 7/2016 | Chaji | H01L 24/97 |
| 2016/0218312 A1* | 7/2016 | Chang | H01L 51/5246 |
| 2018/0083215 A1 | 3/2018 | Wang | |
| 2019/0267432 A1 | 8/2019 | Li et al. | |
| 2021/0223606 A1 | 7/2021 | Xu et al. | |
| 2021/0327970 A1* | 10/2021 | Zhou | H01L 27/3246 |

FOREIGN PATENT DOCUMENTS

| | | | | |
|---|---|---|---|---|
| CN | 105704869 A | | 6/2016 | |
| CN | 104752618 B | | 1/2017 | |
| CN | 106990602 A | | 7/2017 | |
| CN | 107170791 A | * | 9/2017 | ......... H01L 27/3244 |
| CN | 107316888 A | | 11/2017 | |
| CN | 107331693 A | | 11/2017 | |
| KR | 20120004163 A | | 1/2012 | |

OTHER PUBLICATIONS

Extended European Search Report in the European Patent Application No. 18880036.1, dated Oct. 18, 2021.

\* cited by examiner

DISPLAY PANEL AND APPARATUS, AND FABRICATING METHOD THEREOF

CROSS-REFERENCE TO RELATED APPLICATION

This application is a national stage application under 35 U.S.C. § 371 of International Application No. PCT/CN2018/081164, filed Mar. 29, 2018, the contents of which are incorporated by reference in the entirety.

TECHNICAL FIELD

The present invention relates to display technology, more particularly, to a display panel, a display apparatus, and a method of fabricating a display panel.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present invention provides a display panel having a plurality of subpixels, wherein each of the plurality of subpixels has a light blocking region and a light transmissive region surrounding the light blocking region; each of the plurality of subpixels in the light blocking region comprises a first base substrate and a second base substrate facing each other; a first light emitting element and a first reflective block on a side of the first base substrate proximal to the second base substrate; and a second reflective block on a side of the second base substrate proximal to the first base substrate; and wherein the first reflective block and the second reflective block are configured to reflect light emitted from the first light emitting element to the light transmissive region thereby displaying an image.

Optionally, each of the plurality of subpixels in the light blocking region further comprises a first black matrix block between the first reflective block and the first base substrate; and an orthographic projection of the first black matrix block on the first base substrate substantially covers an orthographic projection of the first light emitting element on the first base substrate.

Optionally, an orthographic projection of the first reflective block on the first base substrate substantially covers the orthographic projection of the first light emitting element on the first base substrate; and an orthographic projection of the second reflective block on the second base substrate substantially covers an orthographic projection of the first light emitting element on the second base substrate.

Optionally, each of the plurality of subpixels further comprises a first light diffuser on a side of the first light emitting element distal to the first reflective block and configured to diffuse light emitted from the first light emitting element.

Optionally, each of the plurality of subpixels in the light blocking region further comprises a second black matrix block between the second reflective block and the second base substrate; and an orthographic projection of the second black matrix block on the second base substrate substantially covers the orthographic projection of the first light emitting element on the second base substrate.

Optionally, each of the plurality of subpixels in the light blocking region further comprises a second light emitting element on a side of the second base substrate proximal to the first base substrate; wherein the first reflective block and the second reflective block are configured to reflect light emitted from any one of the first light emitting element and the second light emitting element to the light transmissive region thereby displaying an image; and the first light emitting element and the second light emitting element are independently controlled to emit light.

Optionally, each of the plurality of subpixels in the light blocking region further comprises a first black matrix block between the first reflective block and the first base substrate; an orthographic projection of the first black matrix block on the first base substrate substantially covers an orthographic projection of the first light emitting element on the first base substrate; and the orthographic projection of the first black matrix block on the first base substrate substantially covers an orthographic projection of the second light emitting element on the first base substrate.

Optionally, an orthographic projection of the first reflective block on the first base substrate substantially covers the orthographic projection of the first light emitting element on the first base substrate and the orthographic projection of the second light emitting element on the first base substrate; and an orthographic projection of the second reflective block on the second base substrate substantially covers an orthographic projection of the first light emitting element on the second base substrate and an orthographic projection of the second light emitting element on the second base substrate.

Optionally, an orthographic projection of the first light emitting element on the first base substrate and an orthographic projection of the second light emitting element on the first base substrate are substantially non-overlapping with each other.

Optionally, an orthographic projection of the first light emitting element on the first base substrate and an orthographic projection of the second light emitting element on the first base substrate at least partially overlap with each other.

Optionally, each of the plurality of subpixels further comprises a first light diffuser on a side of the first light emitting element distal to the first base substrate and configured to diffuse light emitted from the first light emitting element; and a second light diffuser on a side of the second light emitting element distal to the second base substrate and configured to diffuse light emitted from the second light emitting element.

Optionally, each of the plurality of subpixels in the light blocking region further comprises a second black matrix block between the second reflective block and the second base substrate; and an orthographic projection of the second black matrix block on the second base substrate substantially covers the orthographic projection of the first light emitting element on the second base substrate and the orthographic projection of the second light emitting element on the second base substrate.

Optionally, the first light emitting element and the second light emitting element in at least one of the plurality of subpixels emit light of different colors respectively.

Optionally, the plurality of subpixels comprises a first subpixel, a second subpixel immediately adjacent to the first subpixel, and a third subpixel immediately adjacent to the second subpixel; the first light emitting element and the second light emitting element of the first subpixel are two different light emitting elements selected from a light emitting element of a first color and a light emitting element of a second color; the first light emitting element and the second light emitting element of the second subpixel are two different light emitting elements selected from a light emitting element of the second color and a light emitting element of a third color; and the first light emitting element and the second light emitting element of the third subpixel are two different light emitting elements selected from a light emitting element of the first color and a light emitting element of the third color.

Optionally, the plurality of subpixels are arranged in a matrix having a plurality of rows and a plurality of columns; light blocking regions in any two adjacent rows of the plurality of rows are staggered; and light blocking regions in any two adjacent columns of the plurality of columns are staggered.

Optionally, the display panel is a dual-side light emitting display panel; and light emitted from one of the plurality of subpixels emits out of the display panel from the first base substrate and the second base substrate in the light transmissive region.

Optionally, the second reflective block is an integral reflective layer extending throughout the light blocking region and the light transmissive region of each of the plurality of subpixels; and light emitted from one of the plurality of subpixels emits out of the display panel from the first base substrate in the light transmissive region.

Optionally, the first reflective block and the second reflective block are diffuse reflection blocks.

Optionally, the first light emitting element is on a side of the first reflective block distal to the first base substrate.

Optionally, the first reflective block is absent in an interface between the first light emitting element and the first base substrate.

Optionally, the display panel further comprises a plurality of signal lines; and wherein at least a portion of the plurality of signal lines extending through the light transmissive region is made of a substantially transparent conductive material.

Optionally, the display panel further comprises a plurality of thin film transistors, each of which is in the light blocking region.

Optionally, the first black matrix block and the first reflective block are absent in the light transmissive region.

In another aspect, the present invention provides a display apparatus comprising the display panel described herein or fabricated by a method described herein.

In another aspect, the present invention provides a method of fabricating a display panel, comprising forming a plurality of subpixels; wherein each of the plurality of subpixels is formed to have a light blocking region and a light transmissive region surrounding the light blocking region; forming each of the plurality of subpixels in the light blocking region comprises forming a first light emitting element and a first reflective block on a first base substrate thereby forming a first substrate; forming a second reflective block on a second base substrate thereby forming a second substrate; and assembling the first substrate and the second substrate together so that the second reflective block is on a side of the second base substrate proximal to the first base substrate; wherein the first reflective block and the second reflective block are configured to reflect light emitted from the first light emitting element to the light transmissive region thereby displaying an image.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a novel display panel, a novel display apparatus, and a method of fabricating a display panel that substantially obviate one or more of the problems due to limitations and disadvantages of the related art. In one aspect, the present disclosure provides a display panel having a plurality of subpixels. In some embodiments, each of the plurality of subpixels has a light blocking region and a light transmissive region surrounding the light blocking region. Each of the plurality of subpixels in the light blocking region includes a first base substrate and a second base substrate facing each other; a first light emitting element and a first reflective block on a side of the first base substrate proximal to the second base substrate; and a second reflective block on a side of the second base substrate proximal to the first base substrate. Optionally, the first reflective block and the second reflective block are configured to reflect light emitted from the first light emitting element to the light transmissive region thereby displaying an image. Optionally, each of the plurality of subpixels in the light blocking region further comprises a first black matrix block between the first reflective block and the first base substrate. Optionally, an orthographic projection of the first black matrix block on the first base substrate substantially covers an orthographic projection of the first light emitting element on the first base substrate.

Various appropriate light emitting elements may be used in the present display panel. Optionally, the light emitting element is an organic light emitting diode. Optionally, the light emitting element is a quantum dots light emitting diode. Optionally, the light emitting element is a micro light emitting diode.

Figure 1A:
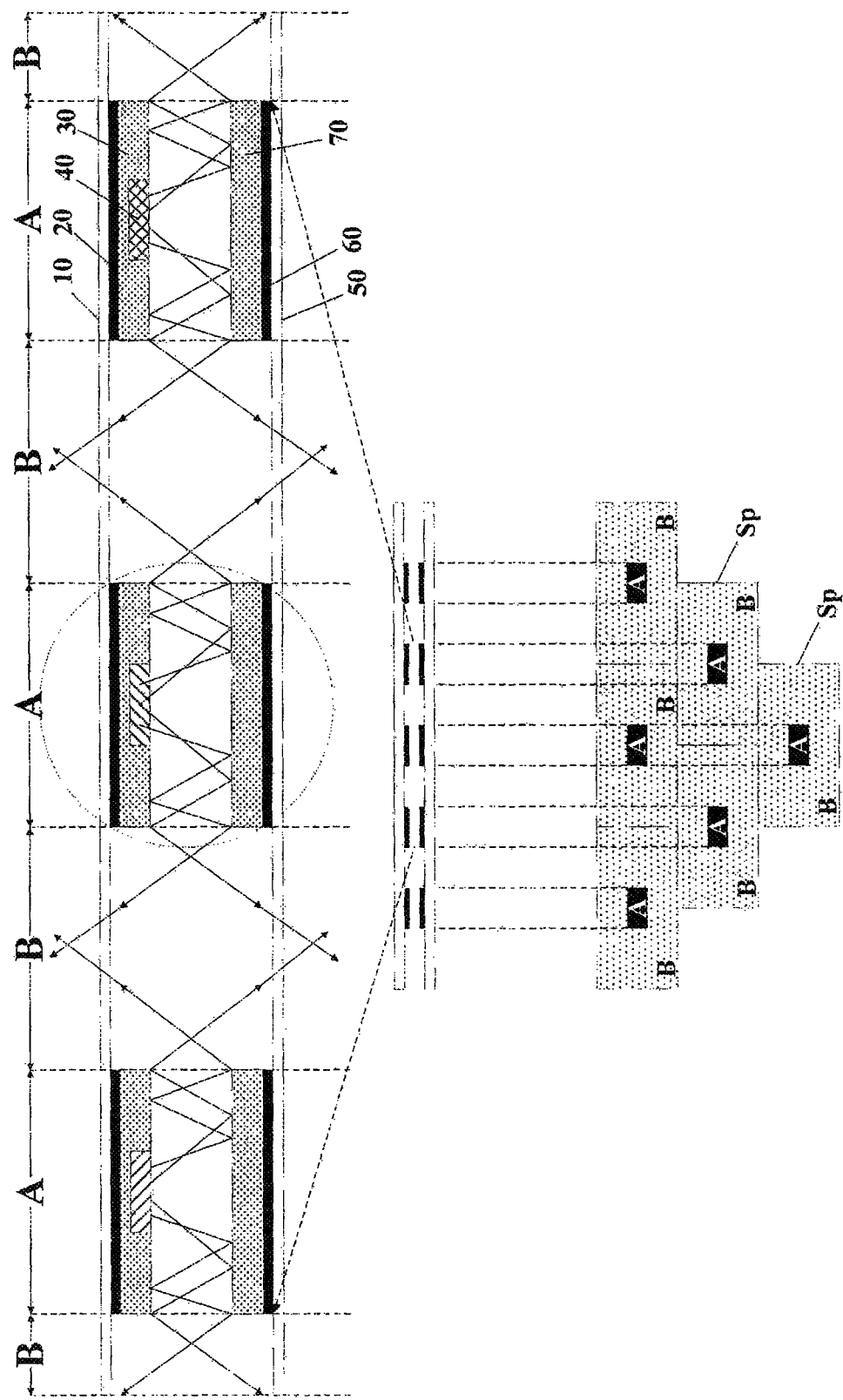
FIG. 1A is a schematic diagram illustrating the structure of a display panel in some embodiments according to the present disclosure.
Figure 2:
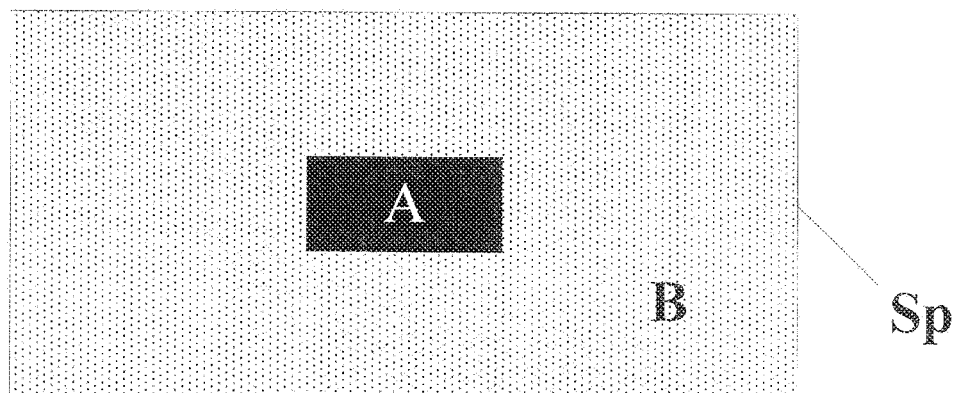
FIG. 2 is a schematic diagram illustrating a subpixel in a display panel in some embodiments according to the present disclosure.
Figure 3A:
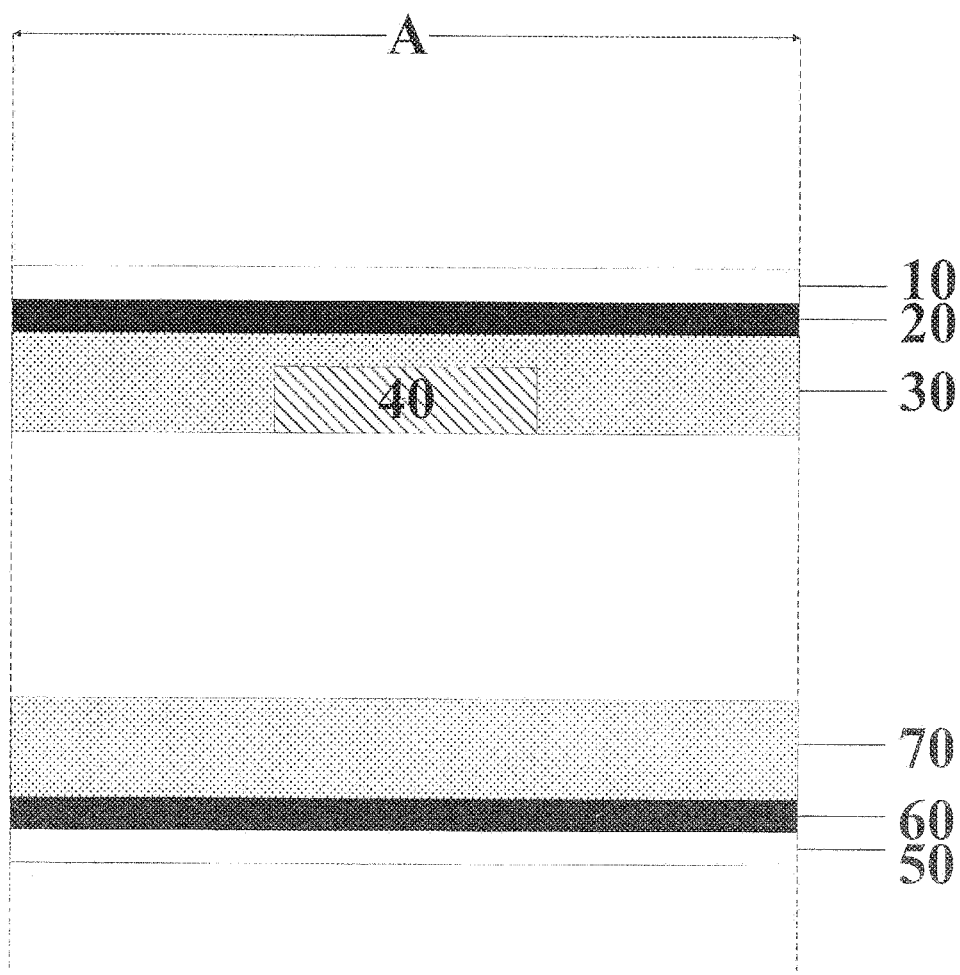
FIG. 3A is a zoom-in view of a region circled by the dashed line in FIG. 1A.

FIG. 1A is a schematic diagram illustrating the structure of a display panel in some embodiments according to the present disclosure. FIG. 2 is a schematic diagram illustrating a subpixel in a display panel in some embodiments according to the present disclosure. FIG. 3A is a zoom-in view of a region circled by the dashed line in FIG. TA, Referring to FIG. 1A, the display panel in some embodiments includes a plurality of subpixels Sp. Referring to FIG. 1A and FIG. 2, each of the plurality of subpixels Sp in the display panel in some embodiments has a light blocking region A and a light transmissive region B surrounding the light blocking region A. Referring to FIG. 3A, each of the plurality of subpixels Sp in the light blocking region A includes a first base substrate 10 and a second base substrate 50 facing each other; a first black matrix block 20 on the first base substrate 10; a first reflective block 30 on a side of the first black matrix block 20 distal to the first base substrate 10; a first light emitting element 40 on a side of the first reflective block 30 distal to the first base substrate 10; and a second reflective block 70 on a side of the second base substrate 50 proximal to the first base substrate 10. An orthographic projection of the first black matrix block 20 on the first base substrate 10 substantially covers an orthographic projection of the first light emitting element 40 on the first base substrate 10. An orthographic projection of the first reflective block 30 on the first base substrate 10 substantially covers the orthographic projection of the first light emitting element 40 on the first base substrate 10. An orthographic projection of the second reflective block 70 on the second base substrate 50 substantially covers an orthographic projection of the first light emitting element 40 on the second base substrate 50. As shown in FIG. 1A, the first reflective block 30 and the second reflective block 70 are configured to reflect light emitted from the first light emitting element 40 to the light transmissive region B. The reflected light emits out of the light transmissive region B, thereby displaying an image. Each of the plurality of subpixels Sp includes a single one of a light emitting element.

Optionally, each of the plurality of subpixels Sp in the light blocking region A further includes a second black matrix block 60 between the second base substrate 50 and the second reflective block 70. An orthographic projection of the second black matrix block 60 on the second base substrate 50 substantially covers an orthographic projection of the first light emitting element 40 on the second base substrate 50.

Figure 1B:
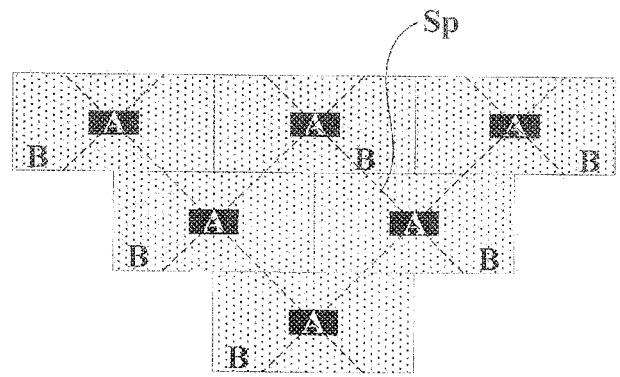
FIG. 1B is a schematic diagram illustrating the division of a display panel into a plurality of subpixels in some embodiments according to the present disclosure.
Figure 1C:
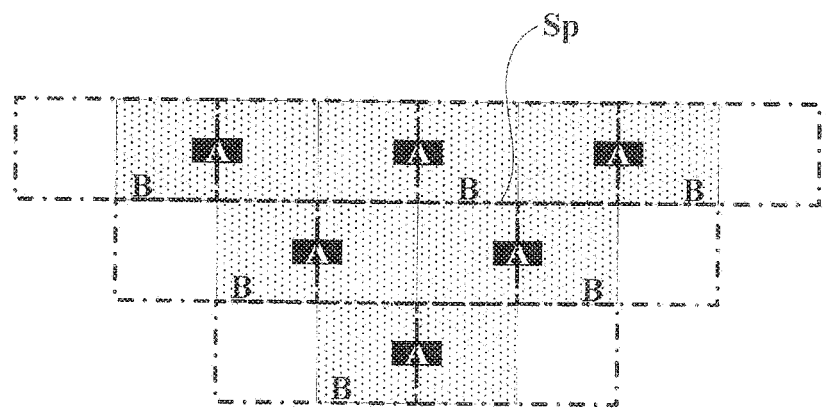
FIG. 1C is a schematic diagram illustrating the division of a display panel into a plurality of subpixels in some embodiments according to the present disclosure.
Figure 1D:
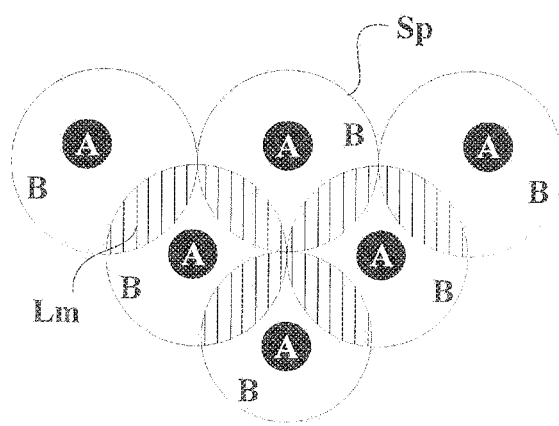
FIG. 1D is a schematic diagram illustrating the division of a display panel into a plurality of subpixels in some embodiments according to the present disclosure.

Referring to FIG. 1A, the display panel in some embodiments includes multiple ones of the light blocking region A, each in one of the plurality of subpixels Sp. The multiple ones of the light blocking region A are spaced apart from each other by the light transmissive region B, The light blocking region A may have any appropriate shapes, e.g., a rectangular shape, a square shape, a circular shape, a round shape, and an elliptical shape. Similarly, the light blocking region B may have any appropriate shapes, e.g., a rectangular shape, a square shape, a circular shape, a round shape, and an elliptical shape. In FIG. 1A, for illustration purpose, the light blocking region A and the light transmissive region B both have a rectangular shape. Similarly, for illustration purpose only, the display panel is divided into the plurality of subpixels Sp, each having a rectangular shape (corresponding to the shape of the light blocking region A and the light transmissive region B). In the present display panel, lights of different colors emitted from adjacent light emitting elements in some embodiments mix with each other thereby generating light of a compound color. Accordingly, various appropriate manners may be employed to divide the display panel into the plurality of subpixels Sp. In one example, and as shown in FIG. 1A, the display panel is divided into the plurality of subpixels Sp, a light blocking region A is approximately at the center of each of the plurality of subpixels Sp. FIGS. 1B to 1D are schematic diagrams illustrating the division of a display panel into a plurality of subpixels in some embodiments according to the present disclosure. In another example, and as shown in FIG. 1B, the display panel is divided into the plurality of subpixels Sp, a light blocking region A is at each vertices of each of the plurality of subpixels Sp. In another example, and as shown in FIG. 1C, the display panel is divided into the plurality of subpixels Sp, two of the light blocking region A are at two opposite sides of each of the plurality of subpixels Sp. In another example, and as shown in FIG. 1D, the light blocking region A has a circular shape, accordingly the display panel may be divided into a plurality of subpixels Sp of a circular shape. As shown in FIG. 1D, lights emitted from adjacent light emitting elements in adjacent light blocking regions mix with each other in a light mixing region Lm. For example, lights of different colors emitted from adjacent light emitting elements in adjacent light blocking regions mix with each other in the light mixing region Lm thereby generating a light of a compound color. The display panel may be divided into a plurality of subpixels Sp in any other appropriate manners. Similarly, when the light blocking region A has a non-circular shape (e.g., a rectangular shape as shown in FIGS. 1A to 1C), lights emitted from adjacent light emitting elements in adjacent light blocking regions also mix with each other in a light mixing region, although not explicitly depicted in FIGS. 1A to 1C.

Various alternative implementations may be practiced to arrange the first light emitting element 40 and the first reflective block 30 on the first base substrate 10. In FIG. 3A, the first reflective block 30 is between the first light emitting element 40 and the first base substrate 10, e.g., the first light emitting element 40 is on a side of the first reflective block 30 distal to the first base substrate 10. Optionally, the display panel includes a recess in the first reflective block 30, the first light emitting element 40 is in the recess of the first reflective block 30. Optionally, the first light emitting element 40 has a surface (e.g., the surface distal to the first base substrate 10) substantially leveled with a surface of the first reflective block 30. Optionally, the first light emitting element 40 is a single-side emitting type light emitting element, e.g., a top emitting-type organic light emitting diode. Optionally, the first light emitting element 40 is a dual-side emitting type light emitting element, e.g., a dual emitting-type organic light emitting diode.

Figure 3B:
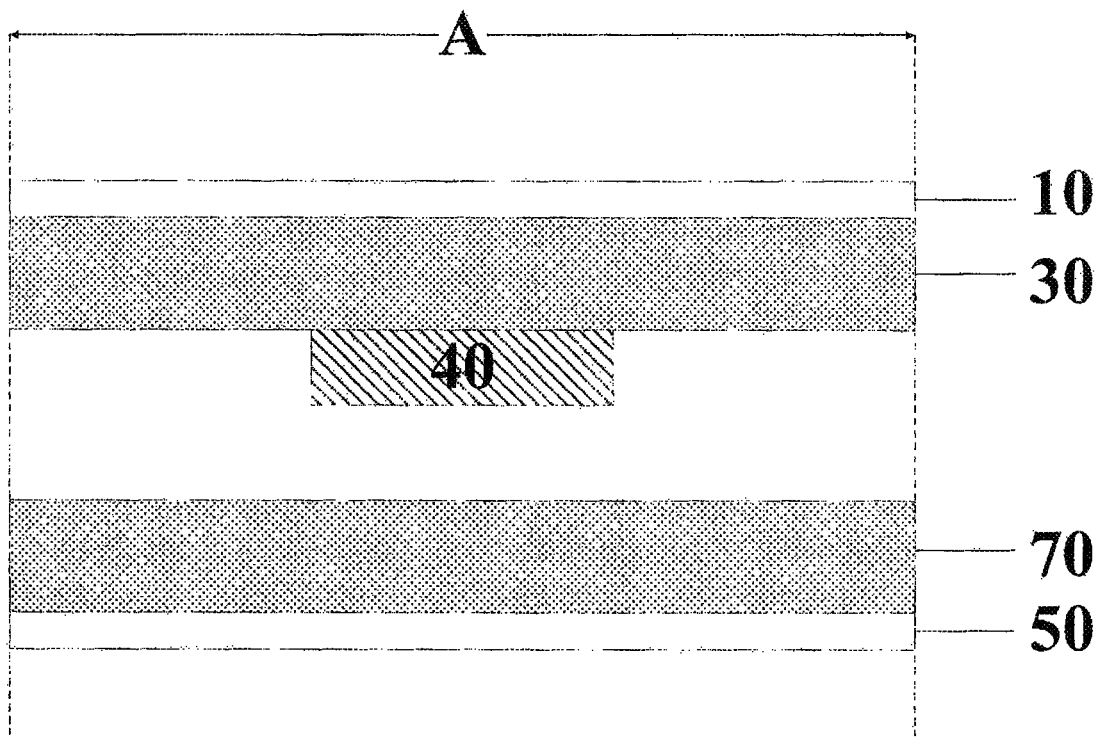
FIG. 3B is a zoom-in view of a region of a display p some embodiments according to the present disclosure.

FIG. 3B is a zoom-in view of a region of a display panel in some embodiments according to the present disclosure. Referring to FIG. 3B, the surface of the first light emitting element 40 is not leveled with the surface of the first reflective block 30. Rather, the first light emitting element 40 is on top of a first reflective block 30 having a substantially uniform thickness. In some embodiments, and referring to FIG. 3B, one or both of the first black matrix block 20 and the second black matrix block 60 are absent in the display panel. The light blocking is performed by the first reflective block 30 and the second reflective block 70. Optionally, the first light emitting element 40 is a single-side emitting type light emitting element, e.g., a top emitting-type organic light emitting diode. Optionally, the first light emitting element 40 is a dual-side emitting type light emitting element, e.g. a dual emitting-type organic light emitting diode.

Figure 3C:
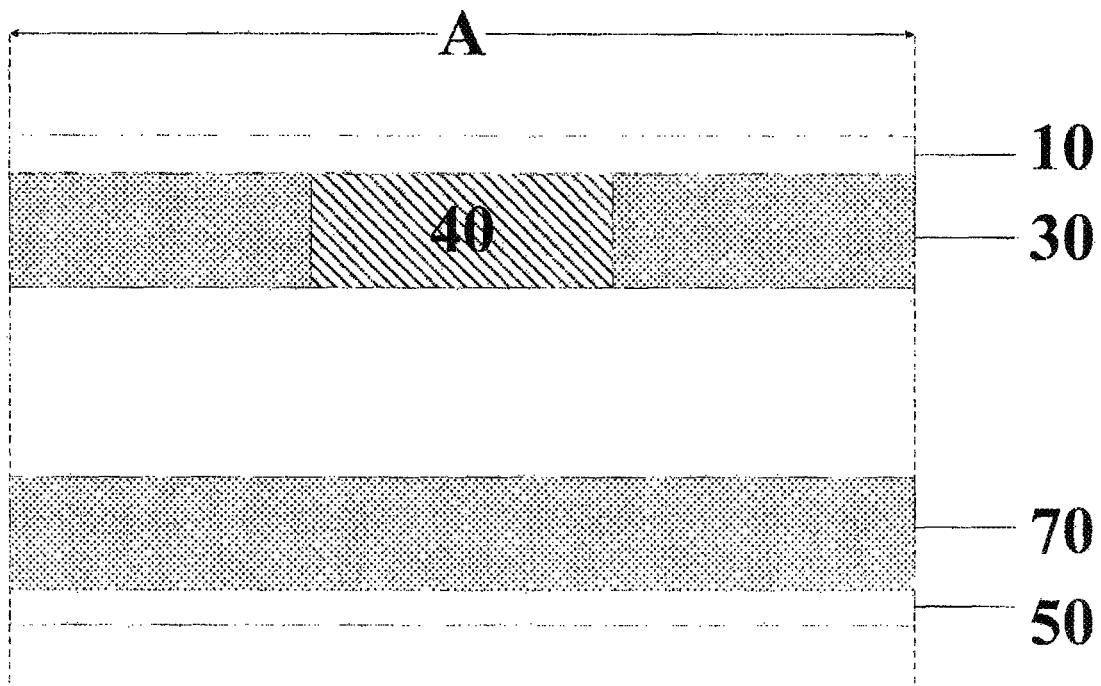
FIG. 3C is a zoom-in view of a region of a display panel in some embodiments according to the present disclosure.

FIG. 3C is a zoom-in view of a region of a display panel in some embodiments according to the present disclosure. Referring to FIG. 3C, the first reflective block 30 is absent in an interface between the first light emitting element 40 and the first base substrate 10. Optionally, the first light emitting element 40 is a single-side emitting type light emitting element, e.g., a top emitting-type organic light emitting diode. For example, a top emitting-type organic light emitting diode has a reflective anode which functions to reflect any light emitted from the top emitting-type organic light emitting diode toward the second base substrate 50.

Figure 3D:
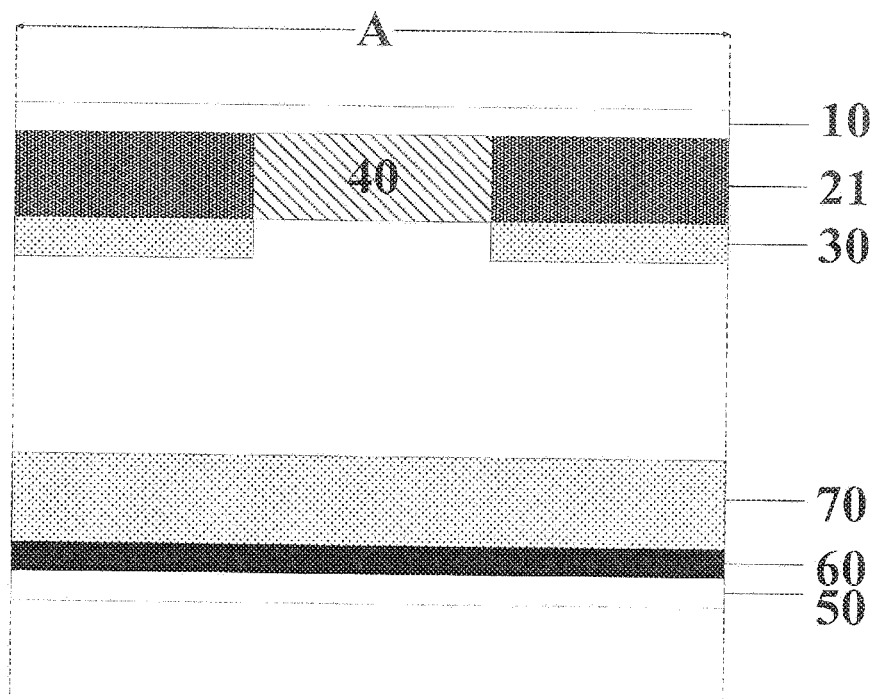
FIG. 3D is a zoom-in view of a region of a display panel in some embodiments according to the present disclosure.

FIG. 3D is a zoom-in view of a region of a display panel in some embodiments according to the present disclosure. Referring to FIG. 3D, in some embodiments, each of the plurality of subpixels Sp in the light blocking region A further includes a pixel definition block 21 for defining a light emitting area of the first light emitting element 40 (e.g., when the first light emitting element 40 is an organic light emitting diode). Optionally, the pixel definition block 21 is made of a light blocking material (e.g., a black material), and the pixel definition block 21 functions as the first black matrix block. Due to the presence of the pixel definition block 21, when a light emitting material of the light emitting element 40 is deposited on the base substrate, the light emitting material deposited in the light emitting area of the first light emitting element 40 is spaced apart from, if any, the light emitting material deposited elsewhere (e.g., on an outer surface of the pixel definition block 21). Light leakage in the display panel can be obviated.

Figure 3E:
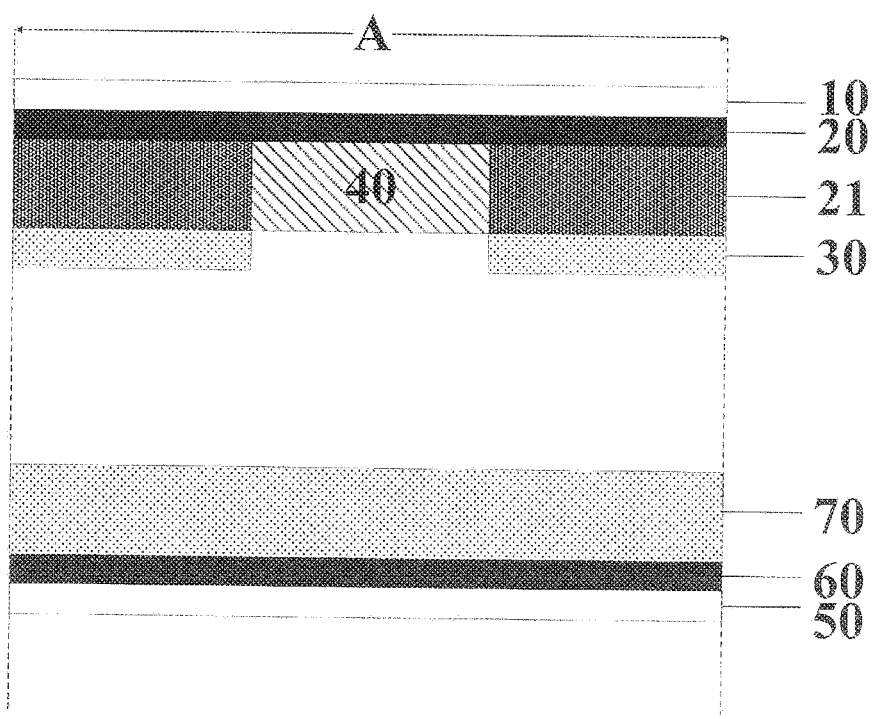
FIG. 3E is a zoom-in view of a region of a display panel in some embodiments according to the present disclosure.

FIG. 3E is a zoom-in view of a region of a display panel in some embodiments according to the present disclosure. Referring to FIG. 3E, in some embodiments, each of the plurality of subpixels Sp in the light blocking region A further includes a pixel definition block 21 for defining a light emitting area of the first light emitting element 40 (e.g., when the first light emitting element 40 is an organic light emitting diode). As compared to the display panel in FIG. 3D, the display panel in each of the plurality of subpixels Sp in the light blocking region A further includes a first black matrix block 20 between the pixel definition block 21 and the first base substrate 10.

In some embodiments, the first reflective block is absent on the first base substrate, light emitted from the first light emitting element 40 is reflected by the second reflective block 70.

The first base substrate 10 and the second base substrate 50 may be spaced apart by any appropriate distance to allow light emitted from the first light emitting element 40 to be reflected (by the first reflective block 30 and the second reflective block 70) outside the light blocking region and into the light transmissive region for image display. Optionally, the first base substrate 10 and the second base substrate 50 are spaced apart by a distance in a range of approximately 1 μm to approximately 1000 μm, e.g., approximately 1 μm to approximately 10 μm, approximately 10 μm to approximately 100 μm, approximately 100 μm to approximately 200 μm, approximately 200 μm to approximately 300 μm, approximately 300 μm to approximately 500 μm, approximately 500 μm to approximately 750 μm, and approximately 750 μm to approximately 1000 μm.

Figure 4:
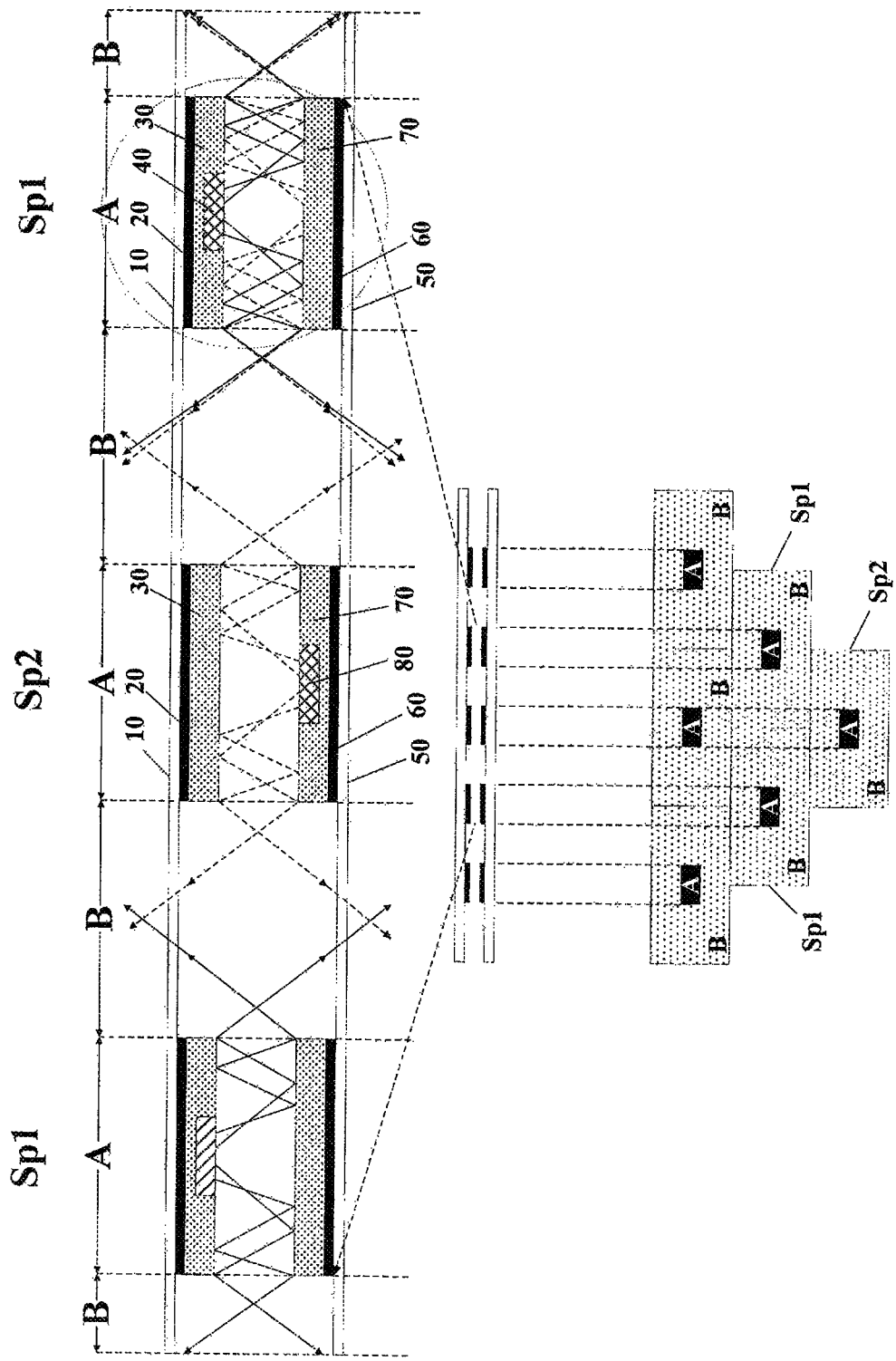
FIG. 4 is a schematic diagram illustrating the structure of a display panel in some embodiments according to the present disclosure.

FIG. 4 is a schematic diagram illustrating the structure of a display panel in some embodiments according to the present disclosure. Referring to FIG. 4, the display panel in some embodiments includes a plurality of first subpixels Sp1 and a plurality of second subpixels Sp2. Each of the plurality of first subpixels Sp1 in the display panel in some embodiments has a light blocking region A and a light transmissive region B surrounding the light blocking region A. Each of the plurality of second subpixels Sp2 in the display panel in some embodiments has a light blocking region A and a light transmissive region B surrounding the light blocking region A. Each of the plurality of first subpixels Sp1 includes a single one of a light emitting element. Each of the plurality of second subpixels Sp2 includes a single one of a light emitting element.

Referring to FIG. 4, each of the plurality of first subpixels Sp1 in the light blocking region A includes a first base substrate 10 and a second base substrate 50 facing each other; a first black matrix block 20 on the first base substrate 10; a first reflective block 30 on a side of the first black matrix block 20 distal to the first base substrate 10; a first light emitting element 40 on a side of the first reflective block 30 distal to the first base substrate 10; and a second reflective block 70 on a side of the second base substrate 50 proximal to the first base substrate 10. An orthographic projection of the first black matrix block 20 on the first base substrate 10 substantially covers an orthographic projection of the first light emitting element 40 on the first base substrate 10. An orthographic projection of the first reflective block 30 on the first base substrate 10 substantially covers the orthographic projection of the first light emitting element 40 on the first base substrate 10. An orthographic projection of the second reflective block 70 on the second base substrate 50 substantially covers an orthographic projection of the first light emitting element 40 on the second base substrate 50. Optionally, each of the plurality of first subpixels Sp1 in the light blocking region A further includes a second black matrix block 60 between the second base substrate 50 and the second reflective block 70. An orthographic projection of the second black matrix block 60 on the second base substrate 50 substantially covers an orthographic projection of the first light emitting element 40 on the second base substrate 50.

Referring to FIG. 4, each of the plurality of second subpixels Sp2 in the light blocking region A includes a first base substrate 10 and a second base substrate 50 facing each other; a second black matrix block 60 on the second base substrate 50; a second reflective block 70 on a side of the second black matrix block 60 distal to the second base substrate 50; a second light emitting element 80 on a side of the second reflective block 70 distal to the second base substrate 50; and a first reflective block 30 on a side of the first base substrate 10 proximal to the second base substrate 50. An orthographic projection of the second black matrix block 60 on the second base substrate 50 substantially covers an orthographic projection of the second light emitting element 80 on the second base substrate 50, An orthographic projection of the second reflective block 70 on the second base substrate 50 substantially covers the orthographic projection of the second light emitting element 80 on the second base substrate 50. An orthographic projection of the first reflective block 30 on the first base substrate 10 substantially covers an orthographic projection of the second light emitting element 80 on the first base substrate 10. As shown in FIG. 4, the first reflective block 30 and the second reflective block 70 are configured to reflect light emitted from any one of the first light emitting element 40 and the second light emitting element 80 to the light transmissive region B. The reflected light emits out of the light transmissive region B, thereby displaying an image. Optionally, each of the plurality of second subpixels Sp2 in the light blocking region A further includes a first black matrix block 20 between the first base substrate 10 and the first reflective block 30. An orthographic projection of the first black matrix block 20 on the first base substrate 10 substantially covers an orthographic projection of the second light emitting element 80 on the first base substrate 10.

Optionally, and referring to FIG. 4, an orthographic projection of the first light emitting element 40 on the first base substrate 10 and an orthographic projection of the second light emitting element 80 on the first base substrate 10 are substantially non-overlapping with each other.

Figure 5:
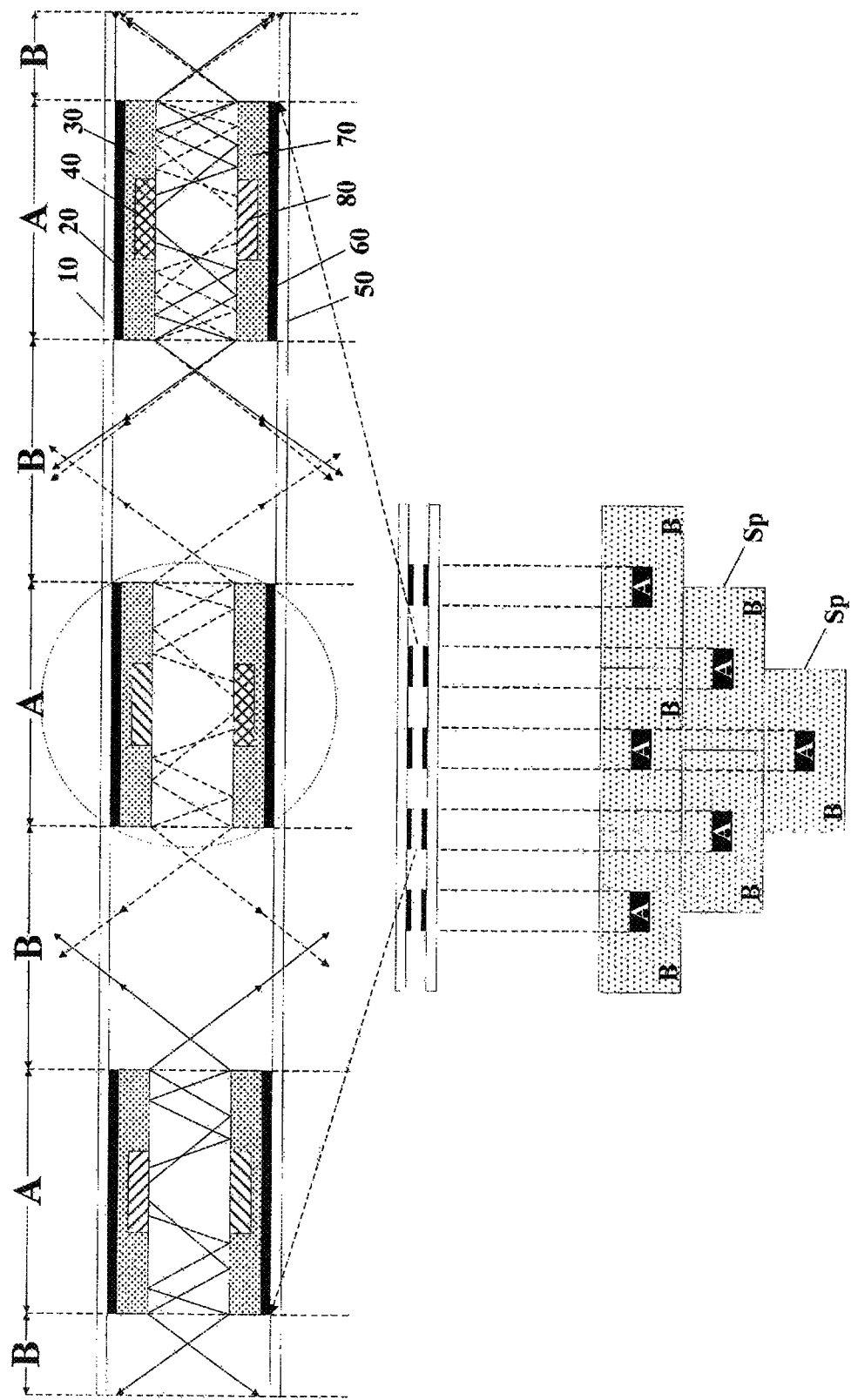
FIG. 5 is a schematic diagram illustrating the structure of a display panel in some embodiments according to the present disclosure.
Figure 6:
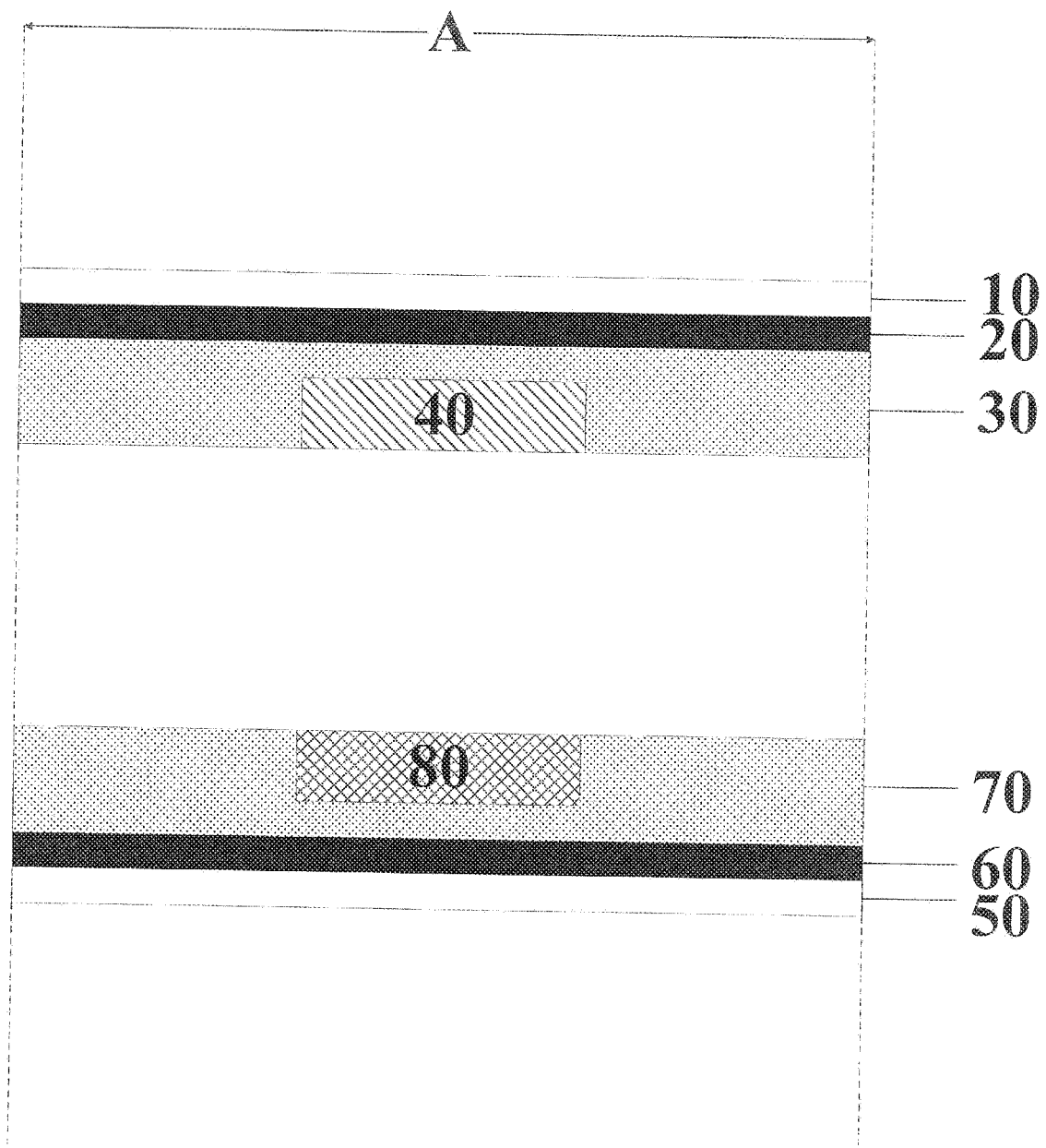
FIG. 6 is a zoom-in view of a region circled by the dashed line in FIG. 5.

FIG. 5 is a schematic diagram illustrating the structure of a display panel in some embodiments according to the present disclosure. FIG. 6 is a zoom-in view of a region circled by the dashed line in FIG. 5. Referring to FIG. 5, the display panel in some embodiments includes a plurality of subpixels Sp. Referring to FIG. 5 and FIG. 6, each of the plurality of subpixels Sp in the display panel in some embodiments has a light blocking region A and a light transmissive region B surrounding the light blocking region A. Each of the plurality of subpixels Sp in the light blocking region A includes a first base substrate 10 and a second base substrate 50 facing each other; a first black matrix block 20 on the first base substrate 10; a first reflective block 30 on a side of the first black matrix block 20 distal to the first base substrate 10; a first light emitting element 40 on a side of the first reflective block 30 distal to the first base substrate 10; a second reflective block 70 on a side of the second base substrate 50 proximal to the first base substrate 10; and a second light emitting element 80 on a side of the second reflective block 70 distal to the second base substrate 50. An orthographic projection of the first black matrix block 20 on the first base substrate 10 substantially covers an orthographic projection of the first light emitting element 40 on the first base substrate 10 and substantially covers an orthographic projection of the second light emitting element 80 on the first base substrate 10. An orthographic projection of the first reflective block 30 on the first base substrate 10 substantially covers the orthographic projection of the first light emitting element 40 on the first base substrate 10 and the orthographic projection of the second light emitting element 80 on the first base substrate 10. An orthographic projection of the second reflective block 70 on the second base substrate 50 substantially covers an orthographic projection of the first light emitting element 40 on the second base substrate 50 and substantially covers an orthographic projection of the second light emitting element 80 on the second base substrate 50. As shown in FIG. 5, the first reflective block 30 and the second reflective block 70 are configured to reflect light emitted from any one (e.g., one or both) of the first light emitting element 40 and the second light emitting element 80 to the light transmissive region B. The reflected light emits out of the light transmissive region B, thereby displaying an image. Each of the plurality of subpixels Sp includes at least two light emitting elements (e.g., at least one on the first base substrate 10 and at least one on the second base substrate 50).

Optionally, each of the plurality of subpixels Sp in the light blocking region A further includes a second black matrix block 60 between the second base substrate 50 and the second reflective block 70. An orthographic projection of the second black matrix block 60 on the second base substrate 50 substantially covers the orthographic projection of the first light emitting element 40 on the second base substrate 50 and substantially covers an orthographic projection of the second light emitting element 80 on the second base substrate 50.

Optionally, and referring to FIG. 5, an orthographic projection of the first light emitting element 40 on the first base substrate 10 and an orthographic projection of the second light emitting element 80 on the first base substrate 10 at least partially overlap with each other.

In some embodiments, the first light emitting element 40 and the second light emitting element 80 are independently controlled to emit light. In one example, the first light emitting element 40 is electrically connected to a first pixel driving circuit and the second light emitting element 80 is electrically connected to a second pixel driving circuit different from the first pixel driving circuit. For example, the first pixel driving circuit includes a first switching thin film transistor electrically connected to a first data line, and the second pixel driving circuit includes a second switching thin film transistor electrically connected to a second data line different from the first data line.

In some embodiments, the first light emitting element 40 and the second light emitting element 80 are configured to receive a same data signal from a same data line.

Figure 7:
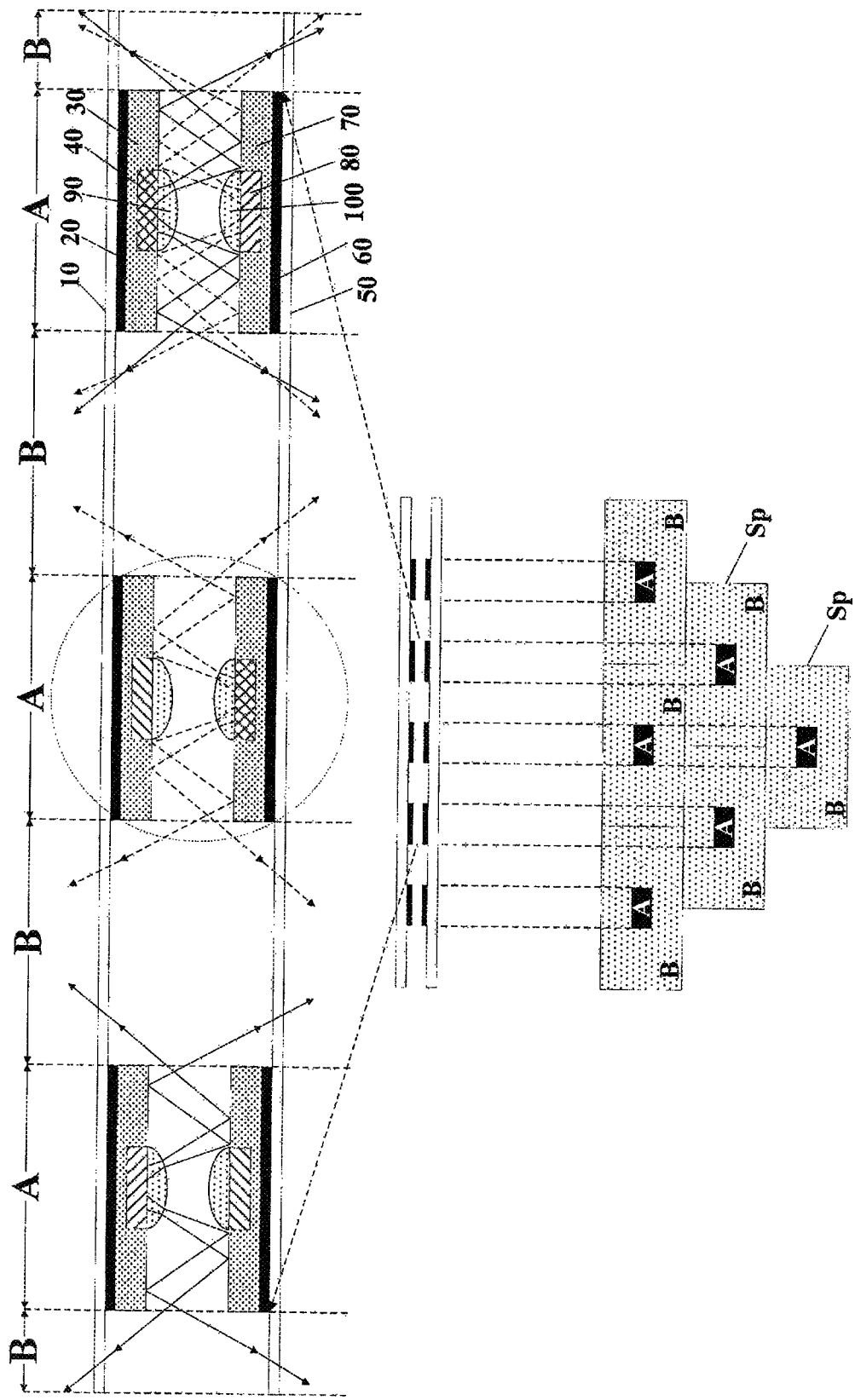
FIG. 7 is a schematic diagram illustrating the structure of a display panel in some embodiments according to the present disclosure.
Figure 8:
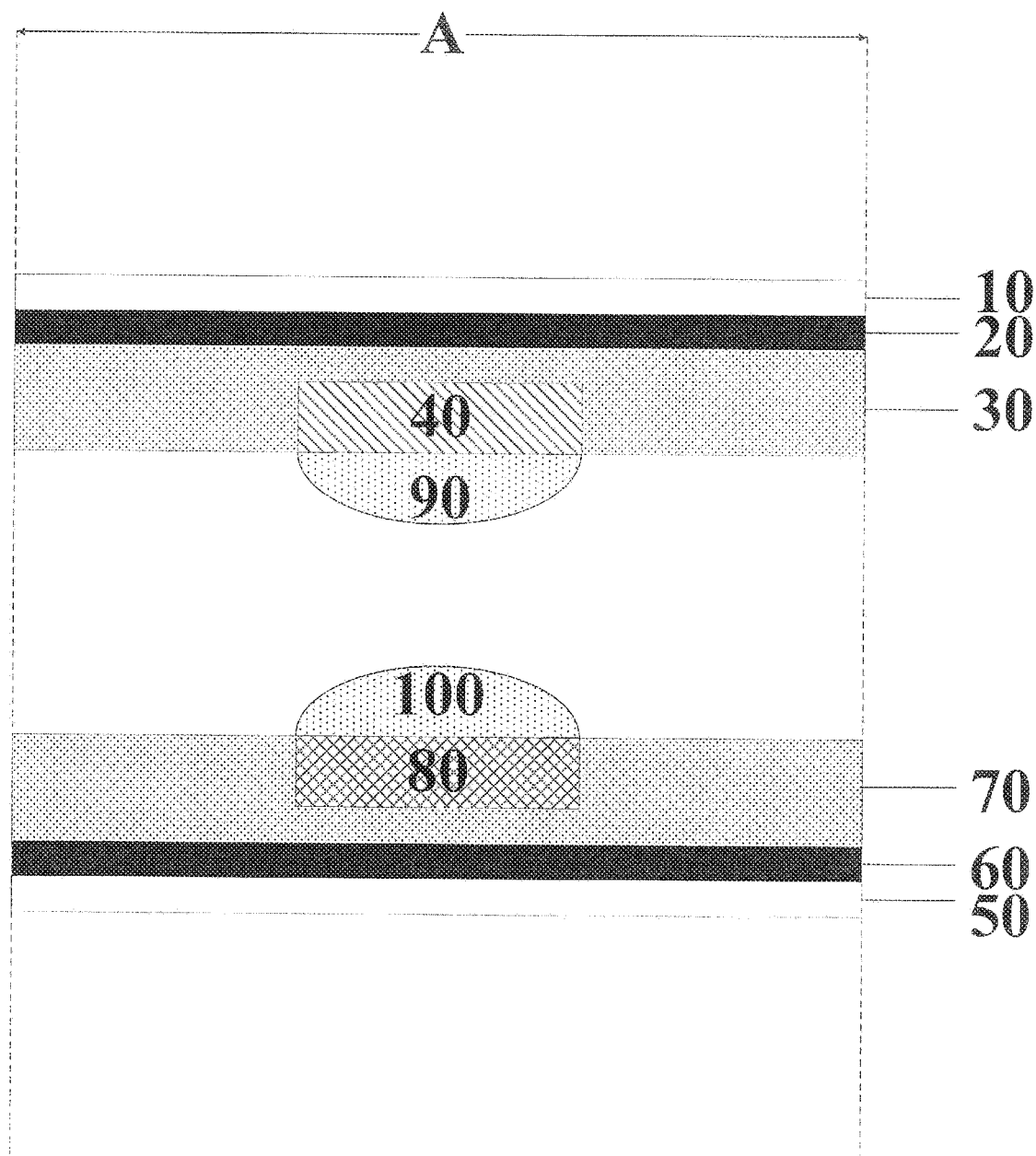
FIG. 8 is a zoom-in view of a region circled by the dashed line in FIG. 7 in some embodiments according to the present disclosure.

FIG. 7 is a schematic diagram illustrating the structure of a display panel in some embodiments according to the present disclosure. FIG. 8 is a zoom-in view of a region circled by the dashed line in FIG. 7 in some embodiments according to the present disclosure. Referring to FIG. 7 and FIG. 8, in some embodiments, each of the plurality of subpixels further includes a first light diffuser 90 on a side of the first light emitting element 40 distal to the first reflective block 30 and configured to diffuse light emitted from the first light emitting element 40. Optionally, an orthographic projection of the first light diffuser 90 on the first base substrate 10 at least partially overlaps with the orthographic projection of the first light emitting element 40 on the first base substrate 10. Optionally, the orthographic projection of the first light diffuser 90 on the first base substrate 10 substantially covers the orthographic projection of the first light emitting element 40 on the first base substrate 10.

In some embodiments, each of the plurality of subpixels further includes a second light diffuser 100 on a side of the second light emitting element 80 distal to the second reflective block 70 and configured to diffuse light emitted from the second light emitting element 80. Optionally, an orthographic projection of the second light diffuser 100 on the second base substrate 50 at least partially overlaps with the orthographic projection of the second light emitting element 80 on the second base substrate 50. Optionally, the orthographic projection of the first light diffuser 90 on the second base substrate 50 substantially covers the orthographic projection of the second light emitting element 80 on the second base substrate 50.

Any appropriate light diffusion materials may be used for making the first light diffuser 90 and the second light diffuser 100. Light diffusion materials may include inorganic materials and organic materials such as a polymer material. In some embodiments, the light diffusers (e.g., the first light diffuser 90 and the second light diffuser 100) are further treated to achieve an enhanced light diffusing ability. Exemplary methods of treating light diffusers include a matte treatment and a bead treatment. In one example, the light diffuser undergoes a matte treatment to impart a haze on the light diffuser. Optionally, the light diffuser has a haze level of at least 20%, e.g., at least 40%, at least 60%, and at least 80%. In another example, the light diffuser undergoes a bead treatment to gain light diffusing function. In some embodiments, the light diffuser includes a body being substantially transparent and a light diffusing agent dispersed in the body. Optionally, the body includes a polymer material. Optionally, the light diffusing agent includes a plurality of light diffusing particles (e.g., beads). The light diffusing agent may include a polymer. Optionally, the light diffusing agent includes an inorganic material. Optionally, the light diffusing agent is made of one or a combination of silicon oxide, poly ethylene propylene, a silicone resin, an acrylic resin, an epoxy resin, a styrene resin, titanium (IV) oxide ($TiO_2$), zinc oxide (ZnO), barium sulfate ($BaSO_4$), calcium sulfate ($CaSO_4$), magnesium carbonate ($MgCO_3$) and aluminum hydroxide ($Al(OH)_3$). Optionally, the light diffuser is a convex lens.

Figure 9:
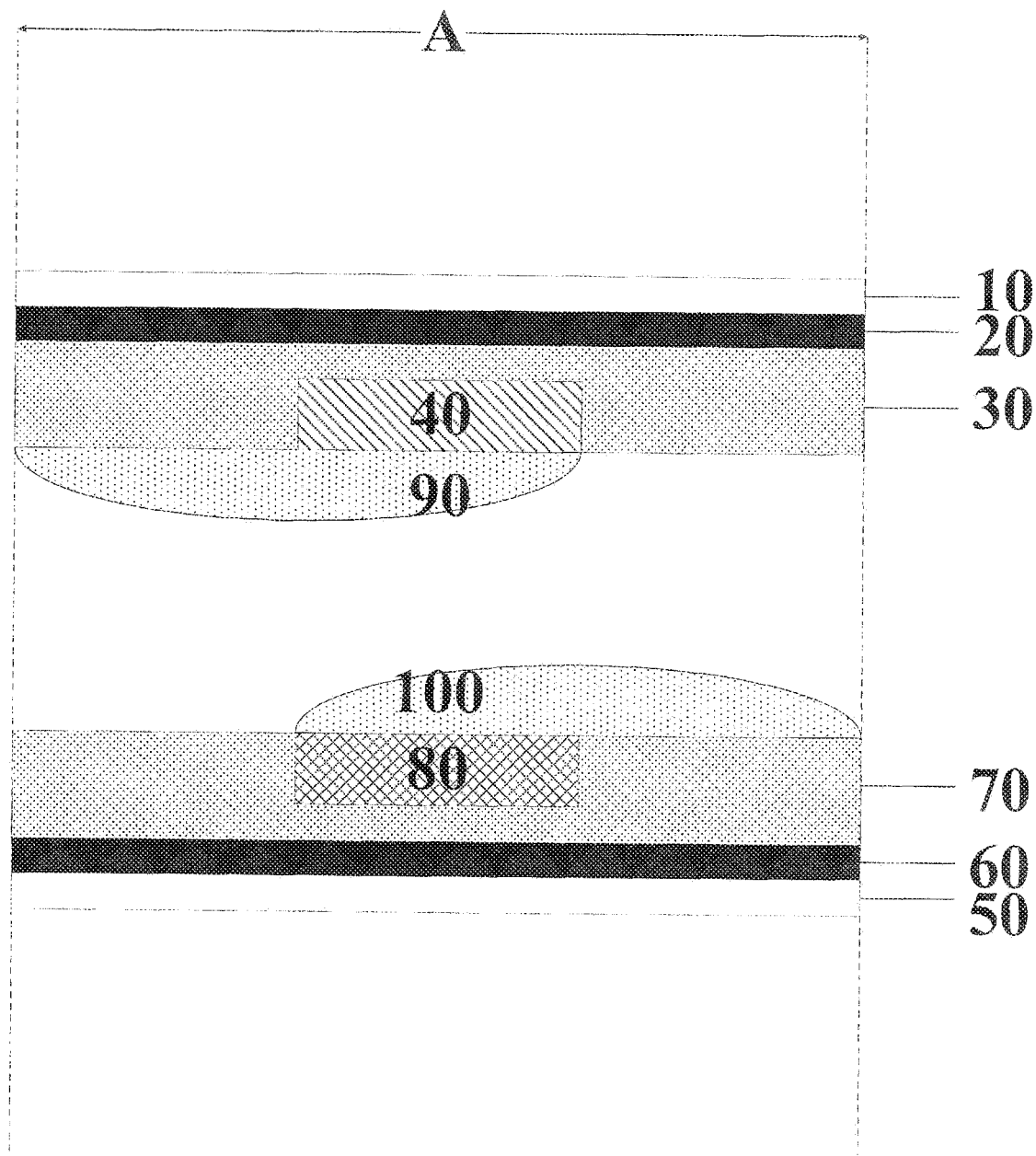
FIG. 9 is a zoom-in view of a region circled by the dashed line in FIG. 7 in some embodiments according to the present disclosure.

FIG. 9 is a zoom-in view of a region circled by the dashed line in FIG. 7 in some embodiments according to the present disclosure. Referring to FIG. 7 and FIG. 9, in some embodiments, the first light diffuser 90 extends outside a region corresponding to the first light emitting element 40, and the second light diffuser 100 extends outside a region corresponding to the second light emitting element 80. Optionally, the orthographic projection of the first light diffuser 90 on the first base substrate 10 substantially covers the orthographic projection of the first light emitting element 40 on the first base substrate 10, and partially overlaps with the orthographic projection of the first reflective block 30 on the first base substrate 10. Optionally, the orthographic projection of the second light diffuser 100 on the second base substrate 50 substantially covers the orthographic projection of the second light emitting element 80 on the second base substrate 50, and partially overlaps with the orthographic projection of the second reflective block 70 on the second base substrate 50. Optionally, the orthographic projection of the first reflective block 30 on the first base substrate 10 substantially covers the orthographic projection of the first light diffuser 90 on the first base substrate 10. Optionally, the orthographic projection of the second reflective block 70 on the second base substrate 50 substantially covers the orthographic projection of the second light emitting element 80 on the second base substrate 50.

Figure 10:
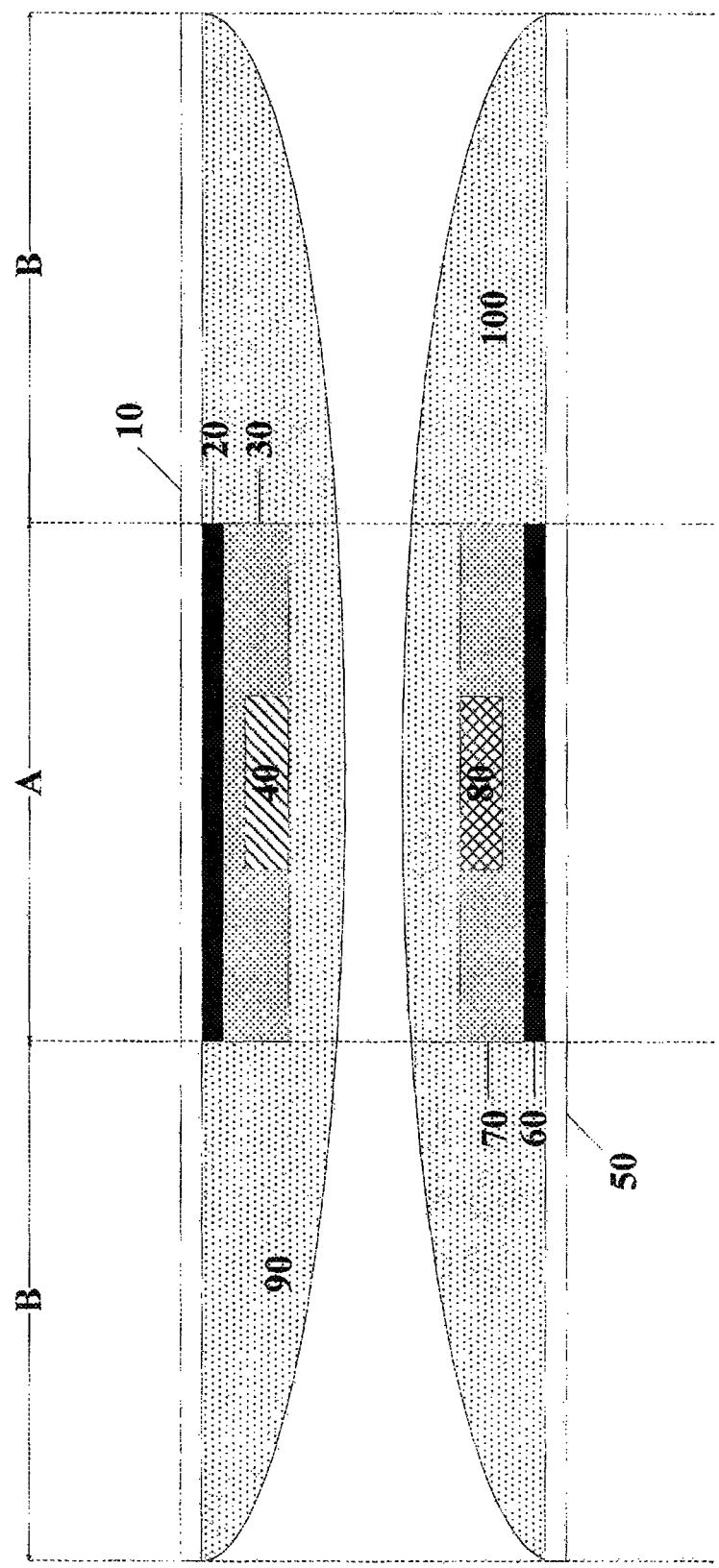
FIG. 10 is a zoom-in view of a region circled by the dashed line in FIG. 7 in some embodiments according to the present disclosure.

FIG. 10 is a zoom-in view of a region circled by the dashed line in FIG. 7 in some embodiments according to the present disclosure. Referring to FIG. 7 and FIG. 10, in some embodiments, the first light diffuser 90 and the second light diffuser 100 extends outside the light blocking region A and into the light transmissive region B. Optionally, the first light diffuser 90 is at least partially in the light blocking region A and at least partially in the light transmissive region B. Optionally, the first light diffuser 90 extends substantially throughout the light blocking region A and at least partially in the light transmissive region B. Optionally, the first light diffuser 90 extends substantially throughout the light blocking region A and extends substantially throughout the light transmissive region B. Optionally, the second light diffuser 100 is at least partially in the light blocking region A and at least partially in the light transmissive region B. Optionally, the second light diffuser 100 extends substantially throughout the light blocking region A and at least partially in the light transmissive region B. Optionally, the second light diffuser 100 extends substantially throughout the light blocking region A and extends substantially throughout the light transmissive region B.

Figure 11:
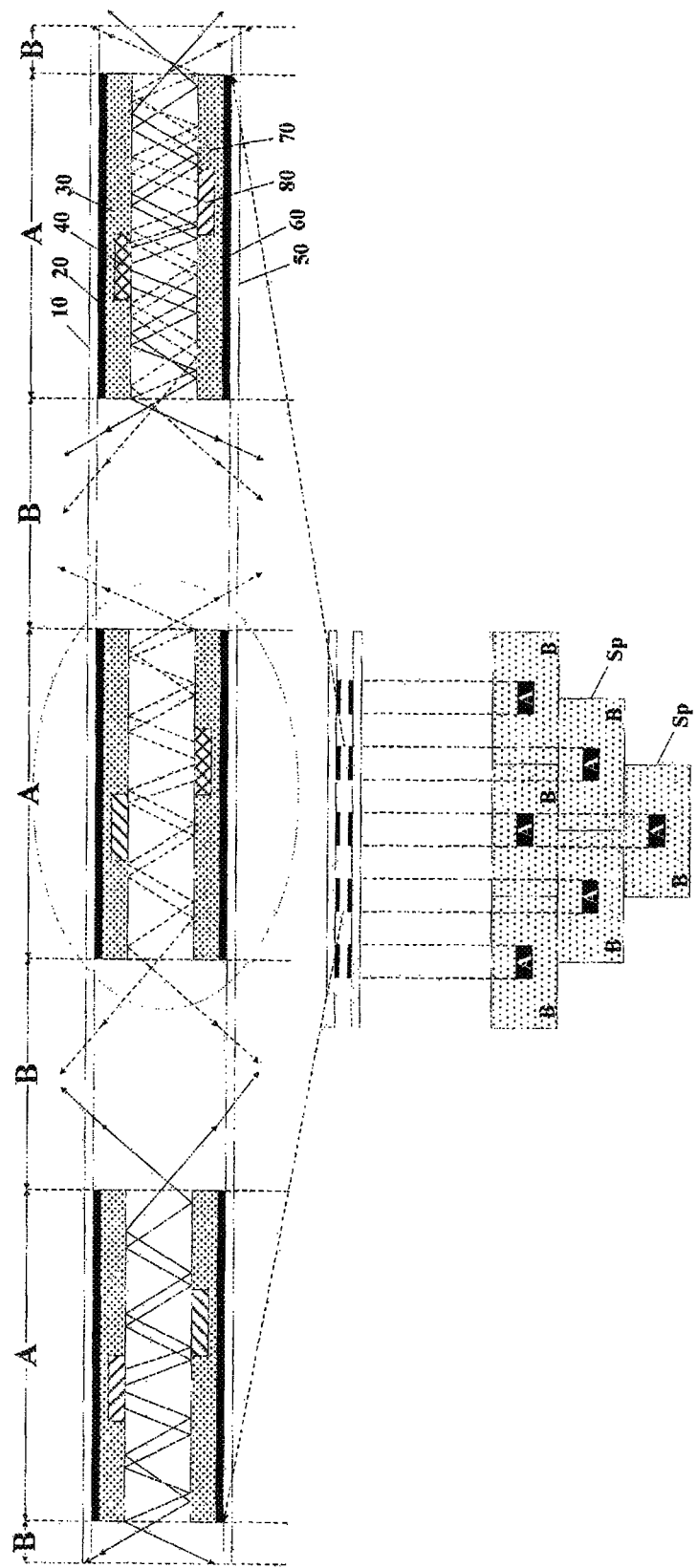
FIG. 11 is a schematic diagram illustrating the structure of a display panel in some embodiments according to the present disclosure.
Figure 12:
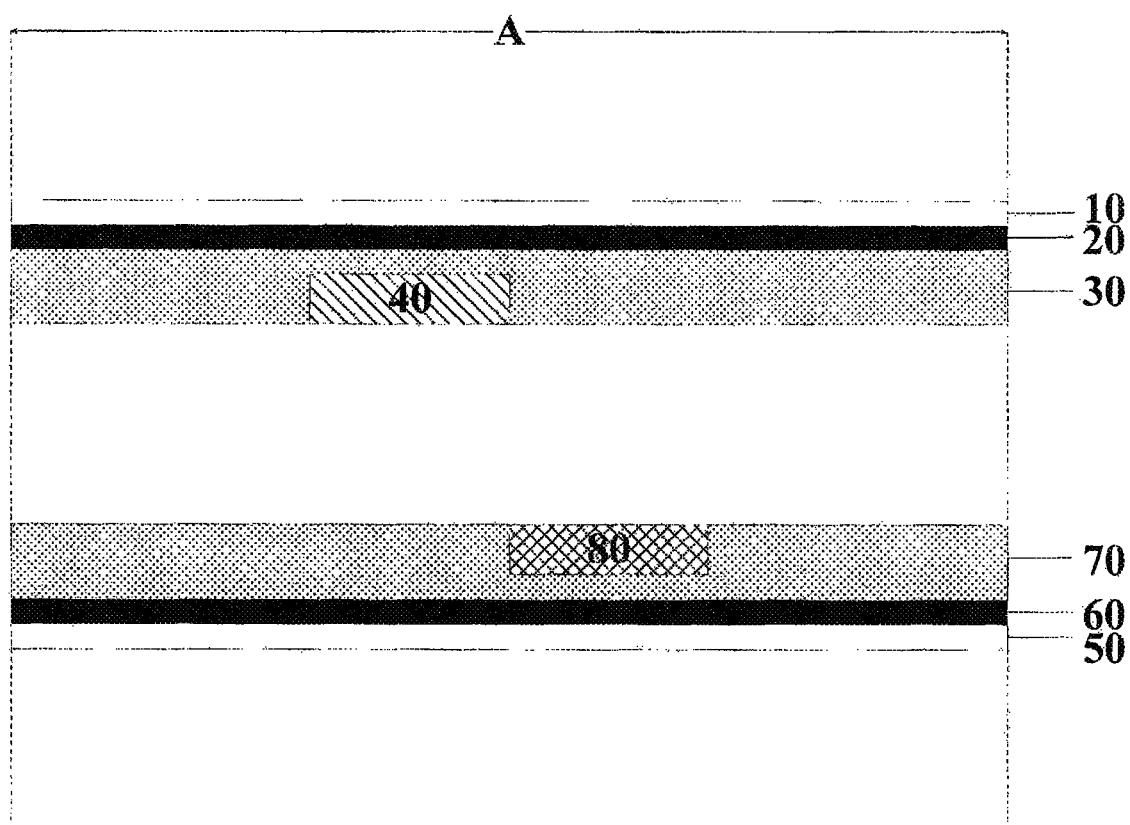
FIG. 12 is a zoom-in view of a region circled by the dashed line in FIG. 11.

FIG. 11 is a schematic diagram illustrating the structure of a display panel in some embodiments according to the present disclosure. FIG. 12 is a zoom-in view of a region circled by the dashed line in FIG. 11. Referring to FIG. 11 and FIG. 12, in some embodiments, an orthographic projection of the first light emitting element 40 on the first base substrate 10 and an orthographic projection of the second light emitting element 80 on the first base substrate 10 are substantially non-overlapping with each other. This design minimizes the probability that light emitted from the first light emitting element 40 irradiates directly into the second light emitting element 80 and is absorbed in the second light emitting element 80, and minimizes the probability that light emitted from the second light emitting element 80 irradiates directly into the first light emitting element 40 and is absorbed in the first light emitting element 40. Instead, a majority of light emitted from the first light emitting element 40 is reflected by the first reflective block 30 and the second reflective block 70 into the light transmissive region B, and a majority of light emitted from the second light emitting element 80 is reflected by the first reflective block 30 and the second reflective block 70 into the light transmissive region B.

Referring to FIG. 11, in some embodiments, the display panel is a dual-side light emitting display panel, in which light emits from both side of the display panel, and the light transmissive region B is light transmissive on both side of the display panel. Optionally, the first reflective block 30 and the second reflective block 70 are absent in the light transmissive region B, the first black matrix block 20 and the second black matrix block 60 are absent in the light transmissive region B. Light emitted from one of the plurality of subpixels Sp emits out of the display panel from the first base substrate 10 and the second base substrate 50 in the light transmissive region.

Figure 13:
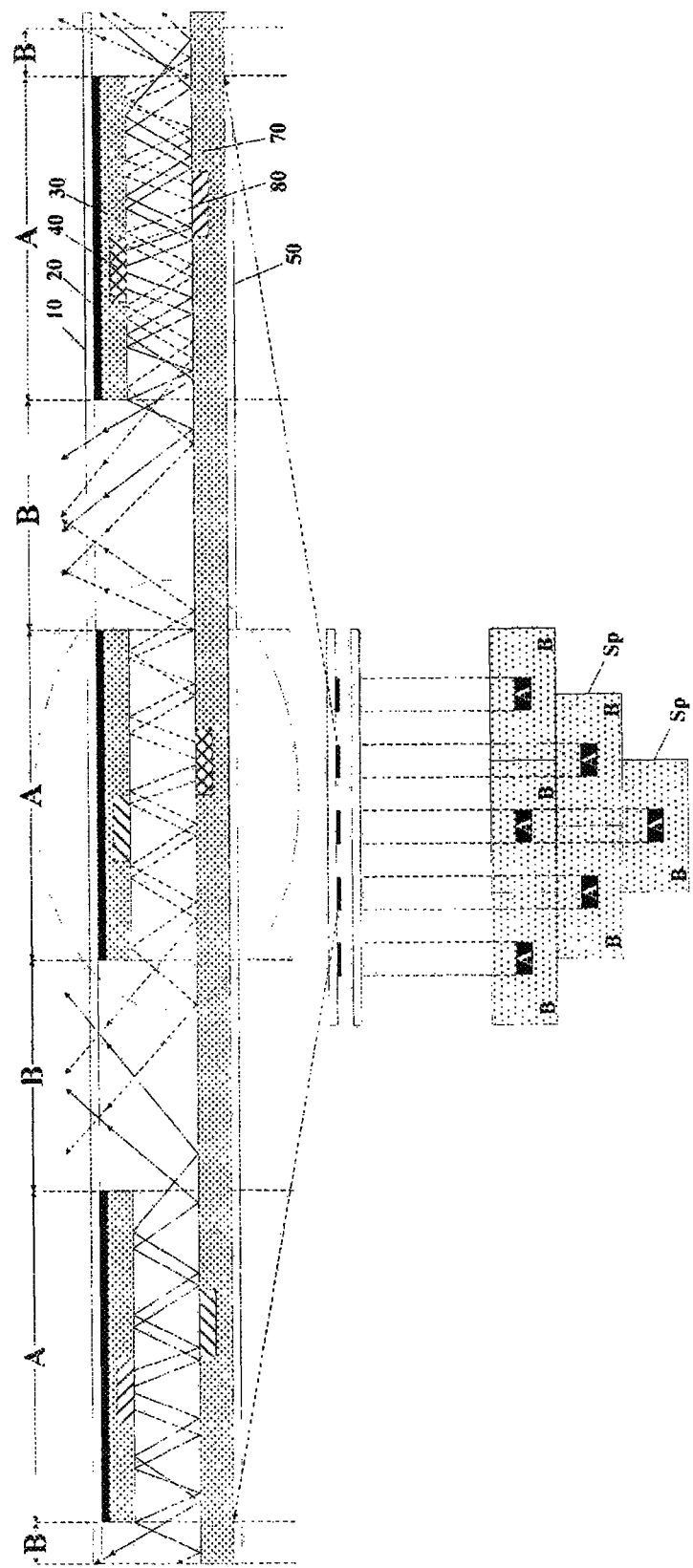
FIG. 13 is a schematic diagram illustrating the structure of a display panel some embodiments according to the present disclosure.

In some embodiments, the display panel is a single side light emitting display panel, in which light emits from a single side of the display panel, and the light transmissive region B is light transmissive on a single side of the display panel. FIG. 13 is a schematic diagram illustrating the structure of a display panel in some embodiments according to the present disclosure. Referring to FIG. 13, in some embodiments, the second reflective block 70 is an integral reflective layer extending throughout the light blocking region A and the light transmissive region B of each of the plurality of subpixels Sp. The first reflective block 30 is absent in the light transmissive region B, and the first black matrix block 20 is absent in the light transmissive region B. Light emitted from one of the plurality of subpixels Sp emits out of the display panel from the first base substrate 10 in the light transmissive region B. Because the entire second base substrate 50 is covered by the integral second reflective block 70, light emitted from the plurality of subpixels Sp does not emit out of the display panel from the second base substrate 50.

In some embodiments, the first reflective block 30 and the second reflective block 70 are diffuse reflection blocks, in order to better reflect the light into the light transmissive region B.

In some embodiments, the display panel further includes a plurality of signal lines. Optionally, at least a portion of the plurality of signal lines extending through the light transmissive region B is made of a substantially transparent conductive material. Optionally, the plurality of signal lines are made of a substantially transparent conductive material.

In some embodiments, the display panel further includes a plurality of thin film transistors, each of which is in the light blocking region A.

The present display panel may be used for making a high-resolution display panel. Because the first light emitting element 40 and the second light emitting element 80 can be independently controlled to emit light, the first light emitting element 40 and the second light emitting element 80 can be configured to receive different data signals from two different data lines, respectively. In some embodiments, the first light emitting element 40 and the second light emitting element 80 are configured to emit light of different colors respectively.

In some embodiments, the plurality of subpixels Sp includes at least a first subpixel, a second subpixel immediately adjacent to the first subpixel, and a third subpixel immediately adjacent to the second subpixel. Optionally, the first light emitting element 40 and the second light emitting element 80 of the first subpixel are two different light emitting elements selected from a light emitting element of a first color and a light emitting element of a second color, the first light emitting element 40 and the second light emitting element 80 of the second subpixel are two different light emitting elements selected from a light emitting element of the second color and a light emitting element of a third color, and the first light emitting element 40 and the second light emitting element 80 of the third subpixel are two different light emitting elements selected from a light emitting element of the first color and a light emitting element of the third color. By having this design, three subpixels can function as equivalents of two pixels in a conventional display panel having at least six subpixels, to display an image. A proportion of the light transmissive region B in the display panel can be greatly increased, and thus the aperture ratio of the display panel can be greatly enhanced.

Figure 14:
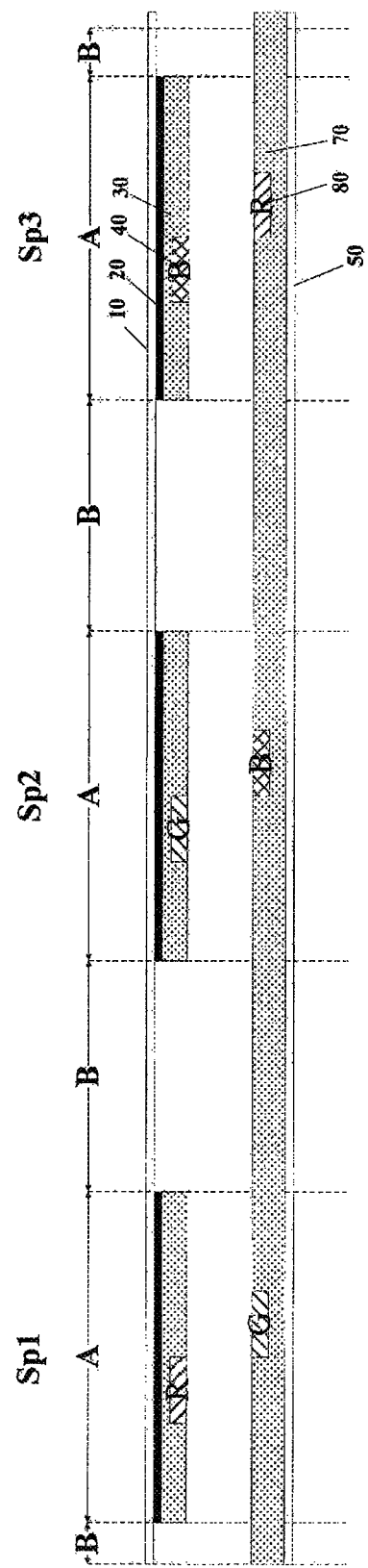
FIG. 14 is a schematic diagram illustrating the structure of a display panel in some embodiments according to the present disclosure.

FIG. 14 is a schematic diagram illustrating the structure of a display panel in some embodiments according to the present disclosure. Referring to FIG. 14, the plurality of subpixels Sp includes three subpixels Sp1, Sp2, and Sp3 adjacent to each other. The first light emitting element 40 of the first subpixel Sp1 is a red light emitting element R for emitting a red light. The second light emitting element 80 of the first subpixel Sp1 is a green light emitting element G for emitting a green light. The first light emitting element 40 of the second subpixel Sp2 is a green light emitting element G for emitting a green light. The second light emitting element 80 of the second subpixel Sp2 is a blue light emitting element B for emitting a blue light. The first light emitting element 40 of the third subpixel Sp3 is a blue light emitting element B for emitting a blue light. The second light emitting element 80 of the third subpixel Sp3 is a red light emitting element R for emitting a red light. Optionally, the plurality of subpixels Sp further includes a subpixel for emitting white light.

In some embodiments, the plurality of subpixels Sp are arranged in a matrix having a plurality of rows and a plurality of columns. Optionally, light blocking regions in any two adjacent rows of the plurality of rows are staggered. Optionally, light blocking regions in any two adjacent columns of the plurality of columns are staggered.

In another aspect, the present disclosure provides a method of fabricating a display panel. In some embodiments, the method includes forming a plurality of subpixels. Each of the plurality of subpixels is formed to have a light blocking region and a light transmissive region surrounding the light blocking region. In some embodiments, the step of forming each of the plurality of subpixels in the light blocking region includes forming a first black matrix block on a first base substrate; forming a first light emitting element and a first reflective block on the first base substrate thereby forming a first substrate; forming a second reflective block on a second base substrate thereby forming a second substrate; and assembling the first substrate and the second substrate together so that the second reflective block is on a side of the second base substrate proximal to the first base substrate. Optionally, the first reflective block and the second reflective block are configured to reflect light emitted from the first light emitting element to the light transmissive region thereby displaying an image. Optionally, the step of forming each of the plurality of subpixels in the light blocking region further includes forming a first black matrix block on a side of the first base substrate proximal to the first reflective block. Optionally, the first substrate is formed so that an orthographic projection of the first black matrix block on the first base substrate substantially covers an orthographic projection of the first light emitting element on the first base substrate. Optionally, the first substrate is formed so that an orthographic projection of the first reflective block on the first base substrate substantially covers the orthographic projection of the first light emitting element on the first base substrate. Optionally, the first substrate and the second substrate are assembled so that an orthographic projection of the second reflective block on the second base substrate substantially covers an orthographic projection of the first light emitting element on the second base substrate.

Various appropriate light emitting elements may be fabricated in the present method. Optionally, the light emitting element is an organic light emitting diode. Optionally, the light emitting element is a quantum dots light emitting diode. Optionally, the light emitting element is a micro light emitting diode.

In some embodiments, forming the first substrate further includes forming a first light diffuser on a side of the first light emitting element distal to the first reflective block and configured to diffuse light emitted from the first light emitting element.

In some embodiments, forming the second substrate further includes forming a second light emitting element on a side of the second reflective block distal to the second base substrate, the second light emitting element formed in the light blocking region in each of the plurality of subpixels. Optionally, the first substrate and the second substrate are assembled so that the orthographic projection of the first black matrix block on the first base substrate substantially covers an orthographic projection of the second light emitting element on the first base substrate. Optionally, the first reflective block and the second reflective block are configured to reflect light emitted from any one of the first light emitting element and the second light emitting element to the light transmissive region thereby displaying an image. Optionally, the first light emitting element and the second light emitting element are formed to be independently controlled to emit light. Optionally, the first substrate and the second substrate are assembled so that an orthographic projection of the first reflective block on the first base substrate substantially covers the orthographic projection of the first light emitting element on the first base substrate and the orthographic projection of the second light emitting element on the first base substrate. Optionally, the first substrate and the second substrate are assembled so that an orthographic projection of the second reflective block on the second base substrate substantially covers an orthographic projection of the first light emitting element on the second base substrate and an orthographic projection of the second light emitting element on the second base substrate. Optionally, an orthographic projection of the first light emitting element on the first base substrate and an orthographic projection of the second light emitting element on the first base substrate are substantially non-overlapping with each other. Optionally, an orthographic projection of the first light emitting element on the first base substrate and an orthographic projection of the second light emitting element on the first base substrate at least partially overlap with each other.

In some embodiments, forming the first substrate further includes forming a first light diffuser on a side of the first light emitting element distal to the first reflective block and configured to diffuse light emitted from the first light emitting element, and forming the second substrate further includes a second light diffuser on a side of the second light emitting element distal to the second reflective block and configured to diffuse light emitted from the second light emitting element.

In some embodiments, forming the second substrate further includes forming a second black matrix block between the second reflective block and the second base substrate, the second black matrix block is formed in the light blocking region in each of the plurality of subpixels. Optionally, the first substrate and the second substrate are assembled so that an orthographic projection of the second black matrix block on the second base substrate substantially covers the orthographic projection of the first light emitting element on the second base substrate and the orthographic projection of the second light emitting element on the second base substrate.

In some embodiments, the first reflective block and the second reflective block are formed to be absent in the light transmissive region. Light emitted from one of the plurality of subpixels emits out of the display panel from the first base substrate and the second base substrate in the light transmissive region.

In some embodiments, forming the second reflective block includes forming an integral reflective layer extending throughout the light blocking region and the light transmissive region of each of the plurality of subpixels. Light emitted from one of the plurality of subpixels emits out of the display panel from the first base substrate in the light transmissive region.

In some embodiments, the first reflective block and the second reflective block are formed as diffuse reflection blocks.

In some embodiments, the method further includes forming a plurality of signal lines. Optionally, at least a portion of the plurality of signal lines extending through the light transmissive region is formed using a substantially transparent conductive material.

In some embodiments, the method further includes forming a plurality of thin film transistors, each of which being formed in the light blocking region.

In some embodiments, the first black matrix block and the first reflective block are formed to be absent in the light transmissive region.

In some embodiments, the first light emitting element and the second light emitting element in at least one of the plurality of subpixels emit light of different colors respectively. Optionally, the first light emitting element and the second light emitting element in any one of the plurality of subpixels emit light of different colors respectively.

In some embodiments, forming the plurality of subpixels includes forming at least a first subpixel, forming a second subpixel immediately adjacent to the first subpixel, and forming a third subpixel immediately adjacent to the second subpixel. Optionally, the first light emitting element and the second light emitting element of the first subpixel are formed to be two different light emitting elements selected from a light emitting element of a first color and a light emitting element of a second color. Optionally, the first light emitting element and the second light emitting element of the second subpixel are formed to be two different light emitting elements selected from a light emitting element of the second color and a light emitting element of a third color. Optionally, the first light emitting element and the second light emitting element of the third subpixel are formed to be two different light emitting elements selected from a light emitting element of the first color and a light emitting element of the third color.

Optionally, the display panel is an organic light emitting diode display panel. Optionally, the display panel is a quantum dots light emitting diode display panel. Optionally, the display panel is a micro light emitting diode display panel.

In another aspect, the present disclosure provides a display apparatus having a display panel described herein or fabricated by a method described herein. Examples of appropriate display apparatuses include, but are not limited to, an electronic paper, a mobile phone, a tablet computer, a television, a monitor, a notebook computer, a digital album, a GPS, etc. In one example, the display apparatus is a smart watch.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having a plurality of subpixels:
wherein a respective subpixel of the plurality of subpixels has a light blocking region and a light transmissive region non-overlapping with the light blocking region;
the respective subpixel of the plurality of subpixels in the light blocking region comprises:
a first base substrate and a second base substrate facing each other;
a first light emitting element and a first reflective block on a side of the first base substrate proximal to the second base substrate; and
a second reflective block on a side of the second base substrate proximal to the first base substrate; and
wherein the first reflective block and the second reflective block are configured to reflect light emitted from the first light emitting element back and forth in the light blocking region and between the first reflective block and the second reflective block in a manner that allows the light emitted from the first light emitting element to propagate to the light transmissive region thereby displaying an image; wherein the second reflective block does not extend outside the light blocking region.

2. The display panel of claim 1, wherein the respective subpixel of the plurality of subpixels in the light blocking region further comprises a first black matrix block between the first reflective block and the first base substrate;
the first reflective block spaces apart the first black matrix block from the first light emitting element; and
an orthographic projection of the first black matrix block on the first base substrate substantially covers an orthographic projection of the first light emitting element on the first base substrate.

3. The display panel of claim 1, wherein an orthographic projection of the first reflective block on the first base substrate substantially covers the orthographic projection of the first light emitting element on the first base substrate; and
an orthographic projection of the second reflective block on the second base substrate substantially covers an orthographic projection of the first light emitting element on the second base substrate.

4. The display panel of claim 1, wherein the respective subpixel of the plurality of subpixels further comprises a first light diffuser on a side of the first light emitting element distal to the first reflective block and configured to diffuse light emitted from the first light emitting element.

5. The display panel of claim 1, wherein the respective subpixel of the plurality of subpixels in the light blocking region further comprises a second black matrix block between the second reflective block and the second base substrate; and
an orthographic projection of the second black matrix block on the second base substrate substantially covers the orthographic projection of the first light emitting element on the second base substrate.

6. The display panel of claim 1, wherein the respective subpixel of the plurality of subpixels in the light blocking region further comprises a second light emitting element on a side of the second base substrate proximal to the first base substrate;
wherein the first reflective block and the second reflective block are configured to reflect light emitted from any one of the first light emitting element and the second light emitting element to the light transmissive region thereby displaying an image; and
the first light emitting element and the second light emitting element are independently controlled to emit light.

7. The display panel of claim 6, wherein the respective subpixel of the plurality of subpixels in the light blocking region further comprises a first black matrix block between the first reflective block and the first base substrate;
an orthographic projection of the first black matrix block on the first base substrate substantially covers an orthographic projection of the first light emitting element on the first base substrate; and
the orthographic projection of the first black matrix block on the first base substrate substantially covers an orthographic projection of the second light emitting element on the first base substrate.

8. The display panel of claim 6, wherein an orthographic projection of the first reflective block on the first base substrate substantially covers the orthographic projection of the first light emitting element on the first base substrate and the orthographic projection of the second light emitting element on the first base substrate; and
an orthographic projection of the second reflective block on the second base substrate substantially covers an orthographic projection of the first light emitting element on the second base substrate and an orthographic projection of the second light emitting element on the second base substrate.

9. The display panel of claim 6, wherein an orthographic projection of the first light emitting element on the first base substrate and an orthographic projection of the second light emitting element on the first base substrate are substantially non-overlapping with each other.

10. The display panel of claim 6, wherein an orthographic projection of the first light emitting element on the first base substrate and an orthographic projection of the second light emitting element on the first base substrate at least partially overlap with each other.

11. The display panel of claim 6, wherein the respective subpixel of the plurality of subpixels further comprises a first light diffuser on a side of the first light emitting element distal to the first base substrate and configured to diffuse light emitted from the first light emitting element; and
a second light diffuser on a side of the second light emitting element distal to the second base substrate and configured to diffuse light emitted from the second light emitting element.

12. The display panel of claim 6, wherein the respective subpixel of the plurality of subpixels in the light blocking region further comprises a second black matrix block between the second reflective block and the second base substrate; and
  an orthographic projection of the second black matrix block on the second base substrate substantially covers the orthographic projection of the first light emitting element on the second base substrate and the orthographic projection of the second light emitting element on the second base substrate.

13. The display panel of claim 6, wherein the first light emitting element and the second light emitting element in at least one of the plurality of subpixels emit light of different colors respectively.

14. The display panel of claim 13, wherein the plurality of subpixels comprises a first subpixel, a second subpixel immediately adjacent to the first subpixel, and a third subpixel immediately adjacent to the second subpixel;
  the first light emitting element and the second light emitting element of the first subpixel are two different light emitting elements selected from a light emitting element of a first color and a light emitting element of a second color;
  the first light emitting element and the second light emitting element of the second subpixel are two different light emitting elements selected from a light emitting element of the second color and a light emitting element of a third color; and
  the first light emitting element and the second light emitting element of the third subpixel are two different light emitting elements selected from a light emitting element of the first color and a light emitting element of the third color.

15. The display panel of claim 1, wherein the plurality of subpixels are arranged in a matrix having a plurality of rows and a plurality of columns;
  light blocking regions in any two adjacent rows of the plurality of rows are staggered; and
  light blocking regions in any two adjacent columns of the plurality of columns are staggered.

16. The display panel of claim 1, wherein the display panel is a dual-side light emitting display panel; and
  light emitted from one of the plurality of subpixels emits out of the display panel from the first base substrate and the second base substrate in the light transmissive region.

17. The display panel of claim 1, wherein the first reflective block and the second reflective block are diffuse reflection blocks.

18. The display panel of claim 1, wherein the first light emitting element is on a side of the first reflective block distal to the first base substrate.

19. The display panel of claim 1, wherein the first reflective block is absent in an interface between the first light emitting element and the first base substrate.

* * * * *